United States Patent
Kim et al.

(10) Patent No.: US 12,431,331 B2
(45) Date of Patent: Sep. 30, 2025

(54) MATERIAL SURFACE REFORMING APPARATUS USING ION IMPLANTATION

(71) Applicant: Radpion Inc., Daejeon (KR)

(72) Inventors: Myung Jin Kim, Daejeon (KR); Jae Keun Kil, Gumi-si (KR); Bom Sok Kim, Seoul (KR)

(73) Assignee: Radpion Inc., Daejeon (KR)

( * ) Notice: Subject to any disclaimer, the term of this patent is extended or adjusted under 35 U.S.C. 154(b) by 351 days.

(21) Appl. No.: 18/214,264

(22) Filed: Jun. 26, 2023

(65) Prior Publication Data
US 2024/0258069 A1    Aug. 1, 2024

(30) Foreign Application Priority Data
Jan. 31, 2023  (KR) .................. 10-2023-0012946

(51) Int. Cl.
| | | |
|---|---|---|
| *H01J 37/317* | (2006.01) | |
| *H01J 37/16* | (2006.01) | |
| *H01J 37/18* | (2006.01) | |
| *H01J 37/20* | (2006.01) | |

(52) U.S. Cl.
CPC .......... *H01J 37/3171* (2013.01); *H01J 37/16* (2013.01); *H01J 37/18* (2013.01); *H01J 37/20* (2013.01); *H01J 2237/202* (2013.01)

(58) Field of Classification Search
CPC ........ H01J 37/3171; H01J 37/16; H01J 37/18; H01J 37/20; H01J 2237/202; C23C 14/50; C23C 14/54; C23C 14/56; C23C 14/48; H01L 21/26566
See application file for complete search history.

(56) References Cited

U.S. PATENT DOCUMENTS

| | | | | |
|---|---|---|---|---|
| 4,346,301 A | * | 8/1982 | Robinson ............ | H01J 37/3171 250/398 |
| 5,093,572 A | * | 3/1992 | Hosono .................. | H01J 37/28 250/306 |
| 6,039,000 A | * | 3/2000 | Libby ................. | H01J 37/3056 250/398 |
| 6,083,567 A | * | 7/2000 | Vesnovsky ............ | C23C 14/022 427/523 |
| 6,403,167 B1 | * | 6/2002 | Lee ........................ | C23C 14/48 427/322 |

(Continued)

FOREIGN PATENT DOCUMENTS

KR    10-2063013 B1    1/2020

*Primary Examiner* — David A Vanore
(74) *Attorney, Agent, or Firm* — Bridgeway IP Law Group, PLLC; Sang Ho Lee; Hyun Woo Shin

(57) ABSTRACT

A material surface reforming apparatus using ion implantation includes: a vacuum chamber unit that has an internal space in which vacuum is selectively maintained, and has a station for placing a material that is a surface reforming target in the internal space; a first ion implanter that is mounted at the upper portion of the vacuum chamber unit, creates plasma composed of ionized gas particles or metal particles, and emits a first ion beam toward the material placed on the station by applying a voltage to the created plasma; and a second ion implanter that is mounted at the upper portion of the vacuum chamber unit, creates plasma composed of ionized gas particles or metal particles, and emits a second ion beam toward the material placed on the station by applying a voltage to the created plasma.

9 Claims, 11 Drawing Sheets

(56) References Cited

U.S. PATENT DOCUMENTS

| | | | | |
|---|---|---|---|---|
| 8,450,193 | B2* | 5/2013 | England | H01L 21/6831 |
| | | | | 438/510 |
| 2001/0032939 | A1* | 10/2001 | Gerlach | H01J 37/08 |
| | | | | 250/492.3 |
| 2003/0024807 | A1* | 2/2003 | Baldwin | C23C 14/46 |
| | | | | 204/192.12 |
| 2006/0091321 | A1* | 5/2006 | Kaga | G01N 23/225 |
| | | | | 250/491.1 |
| 2008/0073582 | A1* | 3/2008 | Shichi | H01J 37/20 |
| | | | | 250/492.21 |
| 2011/0163068 | A1* | 7/2011 | Utlaut | G03F 1/84 |
| | | | | 216/66 |
| 2013/0213945 | A1* | 8/2013 | Stegmann | G01N 23/04 |
| | | | | 219/121.83 |
| 2013/0248354 | A1* | 9/2013 | Keady | C23C 14/5833 |
| | | | | 204/192.33 |
| 2014/0061159 | A1* | 3/2014 | Asahata | H01J 37/02 |
| | | | | 216/85 |
| 2014/0227453 | A1* | 8/2014 | Wang | G01R 31/318572 |
| | | | | 427/523 |
| 2014/0363978 | A1* | 12/2014 | Martin | H01J 37/3053 |
| | | | | 216/61 |
| 2016/0056016 | A1* | 2/2016 | Yasumatsu | H01J 27/024 |
| | | | | 204/298.34 |
| 2016/0240354 | A1* | 8/2016 | Oba | H01J 27/16 |
| 2016/0326635 | A1* | 11/2016 | Gorokhovsky | C23C 14/355 |
| 2020/0027696 | A1* | 1/2020 | Biberger | H01J 37/265 |
| 2020/0051796 | A1* | 2/2020 | Shinada | H01J 37/3417 |
| 2022/0285123 | A1* | 9/2022 | Asai | H01J 37/3244 |
| 2023/0092691 | A1* | 3/2023 | Ma | H01J 37/32807 |
| | | | | 118/719 |
| 2024/0258069 | A1* | 8/2024 | Kim | H01J 37/18 |

* cited by examiner

MATERIAL SURFACE REFORMING APPARATUS USING ION IMPLANTATION

CROSS-REFERENCE TO RELATED APPLICATION

This application claims priority to and the benefit of Korean Patent Application No. 10-2023-0012946, filed on Jan. 31, 2023, the disclosure of which is incorporated herein by reference in its entirety.

BACKGROUND OF THE INVENTION

Field of the Invention

The present disclosure relates to a material surface reforming apparatus using ion implantation, and in more detail, a material surface reforming apparatus using ion implantation that is used to reform a material surface such as improving electrical conductivity such that static electricity is not generated, preventing discoloring or yellowing of a surface, forming a glass film coating that has improved surface hardness and hydrophobicity, or maintaining transparency or the original color, by implanting ions such that a complex compound layer is formed the surface of a material that is a reforming target.

Description of the Related Art

In the related art, as methods of improving the characteristics of a material surface, there are many methods of changing material components or improving a material forming method, or heat treatment, plating, coating, depositing, etc. Currently, a coating method is the most popular method, but such a coating method as limitation such as 'final dimension change' or 'separation'.

In order to solve this problem, as a patent in the related art by the applicant(s), a "method of improving surface conductivity of polymeric material for semiconductor processes" has been disclosed in Korean Patent No. 10-2063013 (registered on Dec. 30, 2019). The method includes: a step of separating metal particles from a metal source substance using any one of a sputtering process, a high-temperature heating process, and an arc generating process by means of a particle generator; a step of separating electrons from the metal particles by hitting thermal electrons against the metal particles or using microwaves by means of an ion generator; a step of generating plasma by heating the electrons and ions having plus electrical charges due to separation of the electrons from the metal particles by means of a plasma generator; a step of conveying a polymeric material for semiconductor processes into a vacuum chamber unit 110; a step of disposing the polymeric material for semiconductor processes on a support in the vacuum chamber unit 110; a step of accelerating ions by applying a voltage to the plasma and implanting the accelerated ions into the surface of the polymeric material for semiconductor processes conveyed in the vacuum chamber unit 100 by means of an ion beam emitter; a step of discharging the polymeric material for semiconductor processes with the ions implanted therein out of the vacuum unit 110; a step of measuring surface resistance of the polymeric material for semiconductor processes with the ions implanted therein using a surface resistance meter; a step of conveying the polymeric material for semiconductor processes with the ions implanted therein to a blocking wall manufacturing apparatus when the measured surface resistance is smaller than preset surface resistance; and a step of manufacturing a blocking wall surrounding a rotor, which is used to apply a chemical onto a semiconductor substrate, using the polymeric material for semiconductor processes with the ions implanted therein by means of the blocking wall manufacturing apparatus.

However, there is a problem in the patent document that only one ion source (ion feeder) that implants ions is provided, so it is possible to reform the surface of a material only in the same pattern, and the ion amount is concentrated only at the center portion, so uniform reforming is not achieved throughout the entire.

Further, there is no critical mind about the case in which there is no need for employing various ion sources in the related art, and there is no technology or apparatus about a technical issue that is generated when various ion sources are employed, and a technology or an apparatus for controlling an emission amount to prevent discoloring, which is generated when emitting an ion beam, and controlling surface temperature of a surface in emission, or application such as glass film coating. The applicant(s) has made an invention described below.

SUMMARY OF THE INVENTION

The present disclosure has been made in an effort to solve the problems described above and an objective of the present disclosure is to provide a material surface reforming apparatus using ion implantation that can reform a surface in various patterns in accordance with the use of materials because it is possible to implant ions into the surface of a material using a first ion implanter and a second ion implanter, and that can achieve uniform reforming throughout the entire because it is possible to divide an ion amount concentration portion into two parts.

Another objective of the present disclosure is to provide a material surface reforming apparatus using ion implantation that can adjust the depth of ion implantation in a material and that can reform a material surface to improve electrical conductivity such that static electricity is not generated, prevent discoloring or yellowing of a surface, form a glass film coating that has improved surface hardness and hydrophobicity, or maintain transparency or the original color, by implanting ions such that a complex compound layer is formed the surface of a material.

In order to achieve the objectives, a material surface reforming apparatus using ion implantation according to the present disclosure includes: a vacuum chamber unit (110) that has an internal space (S1) in which vacuum is selectively maintained, and has a station (111) for placing a material (10) that is a surface reforming target in the internal space (S1); a first ion implanter (120) that is mounted at the upper portion of the vacuum chamber unit (110), creates plasma composed of ionized gas particles or metal particles, and emits a first ion beam toward the material (10) placed on the station (111) by applying a voltage to the created plasma; a second ion implanter (130) that is mounted at the upper portion of the vacuum chamber unit (110), creates plasma composed of ionized gas particles or metal particles, and emits a second ion beam toward the material (10) placed on the station (111) by applying a voltage to the created plasma; and a controller (140) that controls operation of the first ion implanter (120) and the second ion implanter (130) such that a complex compound layer including an electric conductive layer is formed while ions are implanted into the surface of the material (10) by emitting both of the first ion beam and the second ion beam or only one ion beam of the first ion beam and the second ion beam, wherein first ion implanter (120) and the second ion implanter (130) are spaced apart from each other and mounted at positions that are point-symmetric to each other at the upper portion of the vacuum chamber unit (110).

In this configuration, the vacuum chamber unit (110) may have an inlet gate (113) that opens and closes on a first side and an outlet gate (114) that opens and closes on a second side, and the material surface reforming apparatus may further include: a supply chamber (150) that has a hermetic internal space (S2), has a supply gate (151) that opens and closes on a first side thereof, and is disposed at a first side position of the vacuum chamber unit (110), is connected at a second side thereof to the internal space (S1) of the vacuum chamber unit (110) through the inlet gate (113); and a discharge chamber (160) that has a hermetic internal space (S3), is disposed at a second side position of the vacuum chamber unit (110), is connected at a first side thereof to the internal space (S1) of the vacuum chamber unit (110) through the outlet gate (114), and has a discharge gate (161) that opens and closes on a second side thereof.

Further, the material surface reforming apparatus may further include a material conveyer unit (170) that includes: a first conveyer (171) that is disposed in the supply chamber (150) and conveys a material (10) conveyed through the supply gate (151) and being in a pre-surface processing state to the inlet gate; a second conveyer (172) that is disposed in the vacuum chamber unit (110) and conveys a material (10) conveyed through the inlet gate (113) to the station (111); a third conveyer (173) that is disposed in the vacuum chamber unit (110) and conveys a material (10) in a post-surface processing state to the outlet gate (114); and a fourth conveyer (160) that is disposed in the discharge chamber (160) and conveys a material (10) conveyed through the outlet gate (114) to the discharge gate (161).

Further, the material conveyer unit (170) may further include a fifth conveyer (175) that conveys a material (10) supplied from the outside to the supply gate (151) of the supply chamber (150) and a sixth conveyer (176) that conveys a material (10) conveyed through the discharge gate (161) to the outside.

Further, the controller (140) may individually control operation of the supply gate (151), the inlet gate (113), the outlet gate (114), the discharge gate (161), the first conveyer (171), the second conveyer (172), the third conveyer (173), and the fourth conveyer (174) such that a material (10) is conveyed to the inlet gate (113) by the first conveyer (171) by opening the supply gate (151) of the supply chamber (150) with the inlet gate (113) of the vacuum chamber unit (110) closed, a material (10) is conveyed to the station (111) by the second conveyer (172 by opening the inlet gate (113) of the vacuum chamber unit (110 with the supply gate (151) of the supply chamber (150) closed, and a material (10) conveyed to the outlet gate (114) by the third conveyer (173) is conveyed to the discharge gate (161) by the fourth conveyer (174) by opening the outlet gate (114) of the vacuum chamber unit (110) with the inlet gate (113) of the vacuum chamber unit (110) and the discharge gate (161) of the discharge chamber (160) closed.

Further, the vacuum chamber unit (110) may further include a first pressure adjuster (115) that adjusts the pressure of the internal space (S1), the supply chamber (150) may include a second pressure adjuster (155) that adjusts the pressure of the internal space (S2), the discharge chamber (160) may include a third pressure adjuster (165) that adjusts the pressure of the internal space (S3), and the controller (140) may control operation of the first pressure adjuster (115), the second pressure adjuster (155), and the third pressure adjuster (165) such that the internal space (S1) of the vacuum chamber unit (110) is maintained in vacuum at a first pressure required for creating plasma, and the supply chamber (150) and the discharge chamber (160) are maintained in vacuum at a second pressure relatively lower than the atmospheric pressure and relatively higher than the first pressure.

Further, the internal space (S2) of the supply chamber (150) and the internal space (S3) of the discharge chamber (160) may be relatively smaller in volume than the internal space (S1) of the vacuum chamber unit (110).

Further, the supply chamber (150) may further include a volume adjuster (156) detachably mounted over the first conveyer (171) in the internal space (S2), and the volume adjuster (156) may be mounted in the internal space (S2) such that the volume of the internal space (S2) decreases and the time for the second pressure adjuster (155) to adjust the pressure of the internal space (S2) to the second pressure is reduced, and may be separated from the internal space (S2) to expand the space over the first conveyer (171) so that it is possible to convey a material (10) having a relatively large height.

Further, a plurality of inlet gates (113) may be disposed on the first side of the vacuum chamber unit (110), a plurality of discharge chambers may be disposed at the first side position of the vacuum chamber unit (110) and connected at second sides thereof to the internal space (S1) of the vacuum chamber unit (110) through the inlet gates (113), respectively, a plurality of first conveyers (171) may be disposed in the supply chambers (150), respectively, and may convey materials (10) conveyed through the supply gates (151) and being in a pre-surface processing state to the inlet gates (113), respectively, a plurality of second conveyers (172) may be disposed in the vacuum chamber unit (110) and may convey the materials (10) conveyed through the inlet gates (113), respectively, to the station (111), and the controller (140) may control operation such that every time a material (10) is conveyed to the vacuum chamber unit (110) from one supply chamber (150), the internal space (S2) of another supply chamber (150) is maintained in vacuum at the second pressure with a material (10) conveyed in the supply chamber (150).

Further, the controller (140) may individually control operation of the supply gate (151), the inlet gate (113), the outlet gate (114), the discharge gate (161), the first conveyer (171), the second conveyer (172), the third conveyer (174), the fourth conveyer (174), the first ion implanter (120), and the second ion implanter (130) such that a material (10) is conveyed to the inlet gate (113) by the first conveyer (171) by opening the supply gate (151) of the supply chamber (150) with the internal space (S1) of the vacuum chamber unit (110) maintained in vacuum at the first pressure, a material (10) is conveyed to the station (111) by the second conveyer (172) by opening the inlet gate (113) with the supply gate (151) of the supply chamber (150) closed and the internal space (S2) of the supply chamber (150) maintained in vacuum at the second pressure, a complex compound layer is formed on the surface of a material (10) by a first ion beam and a second ion beam with the inlet gate (113) of the vacuum chamber unit (110) closed and the internal space (S1) of the vacuum chamber unit (110) maintained in vacuum at the first pressure, a material (10) conveyed to the outlet gate (114) by the third conveyer (173) is conveyed to the discharge gate (161) by the fourth conveyer (174) by opening the outlet gate (114) of the vacuum chamber unit (110) with the internal space (S3) of the discharge chamber (160) maintained in vacuum at the second pressure, and the inlet gate (113) of the vacuum chamber unit (110) and the discharge gate (161) of the discharge chamber (160) closed, and the discharge gate (161) of the discharge chamber (160) is opened with the outlet gate (114) of the vacuum chamber unit (110) closed.

Further, the vacuum chamber unit (110) may include: a first vacuum chamber (110a) that has an internal space (S1) that is selectively maintained in vacuum, has a station (111) for placing a material (10) in the internal space (S1), has an inlet gate (113) that opens and closes on a first side, and has an intermediate gate (116) that opens and closes on a second side; and a second vacuum chamber (110b) that has an internal space (S1) that is selectively maintained in vacuum, has a station (111) for placing a material (10) in the internal space (S1), is disposed at a second side position of the first vacuum chamber (110a), is connected at a first side to the internal space (S1) of the first vacuum chamber (110a) through the intermediate gate (116), and has an outlet gate (114) that opens and closes on a second side. The material surface reforming apparatus may further include: a supply chamber (150) that has a hermetic internal space (S2), has a supply gate (151) that opens and closes on a first side thereof, and is disposed at a first side position of the first vacuum chamber (110a), is connected at a second side thereof to the internal space (S1) of the first vacuum chamber (110a) through the inlet gate (113); a discharge chamber (150) that has a hermetic internal space (S3) at a second side position of the second vacuum chamber (110b), is connected at a first side thereof to the internal space (S1) of the second vacuum chamber 110b through the outlet gate (114), and has a discharge gate (161) that opens and closes on a second side thereof; a flipper (184) that flips a material (10) that is conveyed from the first vacuum chamber (110a) to the second vacuum chamber (110b); and a material conveyer unit (170) including a first conveyer (171) that is disposed in the supply chamber (150) and conveys a material (10) conveyed through the supply gate (151) and being in a pre-surface reforming state to the inlet gate (113), a second conveyer a (172a) that is disposed in the first vacuum chamber (110a) and conveys a material (10) conveyed through the inlet gate (113) to the station (111), a third conveyer a (173a) that is disposed in the first vacuum chamber (110a) and conveys a material (10) having a first side in a post-surface reforming state to the intermediate gate (116, a second conveyer b (172b) that is disposed in the second vacuum chamber (110b and conveys a material (10) conveyed through the intermediate gate (116) to the station (111), a third conveyer b (173b) that is disposed in the second vacuum chamber (110b) and conveys a material (10) having a second side in a post-surface reforming state to the outlet gate (114), and a fourth conveyer (174) that is disposed in the discharge chamber (160) and conveys a material (10) conveyed through the outlet gate (114) and being in a post-surface reforming state to the discharge gate (161).

Further, the first ion implanter (120) may include: a first ion generator (121) that is provided with gas or metal from a first target provider (125) and separates electrons by hitting thermal electrons against gas particles or metal particles or using microwaves, thereby forming first plasma composed of ionized gas particles or ionized metal particles; a first ion beam emitter (122) that implants first ions into the surface of the material (10) while emitting an ion beam by applying a voltage over 5~200 kV to the first plasma; a first plasma power source (123) that supplies power to the first ion generator (121); and a first ion beam emission power source (124) that supplies power to the first ion beam emitter (122); and may implant a first ion beam such that the molecular chains of the material (10) are cut or double bonding is made by ion implantation and a complex compound layer including an electric conductive layer is formed on the surface of the material (10). The second ion implanter (130) may include: a second ion generator (131) that is provided with gas or metal from a second target provider (135) and separates electrons by hitting thermal electrons against gas particles or metal particles or using microwaves, thereby forming second plasma composed of ionized gas particles or ionized metal particles; a second ion beam emitter (132) that implants second ions into the surface of the material (10) by emitting an ion beam while applying a voltage over 5~200 kV to the second plasma; a second plasma power source (133) that supplies power to the second ion generator (132); and a second ion beam emission power source (134) that supplies power to the second ion beam emitter (122); and may implant a second ion beam such that the molecular chains of the material (10) are cut or double bonding is made by ion implantation and a complex compound layer including an electric conductive layer is formed on the surface of the material (10).

Further, the station (111) on which a material (10) is placed may be a stage that can be driven in four or more axial directions for uniform emission on a material (10); when the axial directions constituting the surface of the station (111) are defined as an x axis and a y axis, and the axial direction in the height direction of the station in the vacuum chamber unit (110) is defined as a z axis, the station (111) may be 4-axially driven including linear movement in the x-axial direction, linear movement in the y-axial direction, rotation about the z axis, and rotation about the x axis or the y axis; when the center of the top of the vacuum chamber unit (110) is $C_0$, the center of the bottom of the first ion beam emitter (122) is $C_1$, the center of the bottom of the second ion beam emitter (132) is $C_2$, the center of the surface of a material (10) is $C_3$, $\angle C_1 C_3 C_0$ is $\theta_1$, and $\angle C_2 C_3 C_0$ is $\theta_2$, the controller (140) may control the station (111) to rotate by $\theta_1$ counterclockwise about the y axis when first ions are implanted, and may control the station (111) to rotate by $\theta_2$ clockwise about the y axis.

Further, when first ions are implanted or second ions are implanted, the controller (140) may control the station (111) such that the axis directions constituting the surface of the station (111) in the x-axial and the y-axial direction such that uniform ion implantation distribution is achieved on the surface of the material (10) when ion beam implantation profiles overlap.

Further, the vacuum chamber unit (110) may further include a height adjuster (112) that adjusts the height of the station (111) in the z-axial direction may be further included.

The apparatus may further include a material heating unit (180) that is disposed at positions out of a virtual straight space between the first ion beam emitter (122) and the material (10) and at positions out of a virtual straight space between the second ion beam emitter (132), and is positioned over the station (111) in order not to interfere with emission of an ion beam from the first ion beam emitter (122) and emission of an ion beam from the second ion beam emitter (132), and that heats the material (10) in a non-contact type to be able to control an ion implantation depth of the material (10).

Further, the material heating unit (180) may include a plurality of halogen lamps (181) radiating heat and reflective plates (182) reflecting light from the halogen lamps (181) to the surface of a material (10) that are formed in a circumferential direction around the material (10) over the material in order to be able to heat the material (10) in a non-contact type.

Further, the apparatus may further include a material cooling unit (190) that is disposed at positions out of a virtual straight space between the first ion beam emitter (122) and the material (10) and at positions out of a virtual straight space between the second ion beam emitter (132), and is positioned over the station (111) in order not to interfere with emission of an ion beam from the first ion beam emitter (122) and emission of an ion beam from the second ion beam emitter (132), and that cools the material (10) in a non-contact type. The material cooling unit (190) cools the surface of a material (10) in order to be able to prevent discoloring or yellowing of the material due to heat that is generated by ion implantation, whereby it is possible to maintain the original transparency or color of a material (10).

The material cooling unit (190) may include an inert gas supply pipe (191) that is supplied with an inert gas from the outside of the vacuum chamber unit (110), a circular pipe (192) may be connected to an end of the inert gas supply pipe (191), and a plurality of spray holes (193) is formed inside the circle of the circular pipe (192), so that an inert gas is sprayed to the surface of a material (10) in order to be able to cool the material (10) in a non-contact type.

Further, the material cooling unit (190 may further include a liquid nitrogen pipe (195) inserted and sealed in the inert gas supply pipe (191) and the circular pipe (192) and supplied with liquid nitrogen from the outside, and, depending on control by the controller, only liquid nitrogen may be supplied into the liquid nitrogen pipe (195) without an inert gas sprayed to the surface of the material (10) through the spray holes (193) in a mode for removing moisture in the vacuum chamber unit (110) and only the outer surface of the material cooling unit (190) may be cooled, thereby inducing the moisture in the vacuum chamber unit (110) to condense on the outer surface of the material cooling unit (190).

Further, in order to improve the mechanical properties of the material 10, the controller (140) may perform control such that any one target provider of the first target provider (125) and the second target provider (135) is provided with nitrogen ($N_2$) and the other target provider is provided with at least one of Al, C, FE, Ti, and Cr.

Further, in order to improve antibiotic and antivirus characteristics of the material (10), the controller (140) may perform control such that the first target provider (125) or the second target provider (135) is provided with Cu.

Further, in order to improve corrosion resistance of the material (10), the controller (140) may perform control such that the first target provider (125) or the second target provider (135) is provided with oxygen ($O_2$).

Further, when metal targets that are supplied to the first target provider (125) or the second target provider (135) are n (here, n is a natural number over 2) metal targets and volume ratios calculated in consideration of the atomic weight of the n metal targets are the same, the metal targets are manufactured in a circular shape such that the n metal targets are uniformly distributed and the first plasma or the second plasma is uniformly formed and distributed. The metal targets are divided into nk (k is a natural number) angles of the circle, in which the first, second, . . . n-th divided fan-shaped sections may be n different metal targets, the (n+1)-th, (n+2)-th, . . . 2n-th divided fan-shaped sections may be n different metal targets, and (n(k−1)+1)-th, (n(k−1)+2)-th, and nk-th divided fan-shaped sections may be n different metal targets.

Further, when metal targets that are supplied to the first target provider (125) or the second target provider (135) are n (here, n is a natural number over 2) metal targets and volume ratios calculated in consideration of the atomic weight of the n metal targets are V1, V2, . . . , Vn, the metal targets are formed in a circular shape such that the n metal targets are uniformly distributed and the first plasma or the second plasma is uniformly formed and distributed. The metal targets are divided into k (k is a natural number) angles of the circle, and sections obtained by dividing again the divided sections in accordance with the volume ratios of V1, V2, . . . , Vn may be n different metal targets.

In order to accurately control the material heating unit (180) and the material cooling unit (190), one or more temperature sensors (141 that can measure a temperature in close contact with a side of a material (10) are inserted in the station (111), and if necessary, the temperature sensors (141) are protruded perpendicular to the plane of the station (111) on which a material (10) is placed, thereby measuring a temperature in close contact with a side of the material (10), in which it is possible to transmit a measurement value of the temperature sensor (141) in a wireless type so that the controller (140) can receive the measurement value of the temperature sensor (141) even though the station (111) is controlled with respect to four or more axes.

Further, oxygen ($O_2$) plasma is formed at any one ion generator of the first ion generator (121) or the second ion generator (131) and plasma of a hydrophobic substance is generated at the other one ion generator, whereby it is possible to improve the degree of hardening and hydrophobicity of the surface of a material 10 coated with silazane or another Si-based compound by implanting ions into the surface of the material.

Further, the material (10) may be a polymer or plastic material.

Meanwhile, the material heating unit (180) may heat the material (10) at least over 100° C. and under the melting point of the material (10) so that hydrogen separating from the material (10) from producing moisture by bonding with oxygen and condensing on the surface of the material (10) due to oxygen ion implantation into the material (10) and oxygen ions can be more smoothly implanted into the surface of the material (10).

According to the material surface reforming apparatus using ion implantation of the present disclosure, the following effects are achieved.

First, the vacuum chamber unit (110) has the internal space (S1) in which vacuum is selectively maintained, and has the station (111) for placing a material (10) that is a surface reforming target in the internal space (S1); the first ion implanter (120) is mounted at the upper portion of the vacuum chamber unit (110), creates plasma composed of ionized gas particles or metal particles, and emits a first ion beam toward the material (10) placed on the station (111) by applying a voltage to the created plasma; the second ion implanter (130) is mounted at the upper portion of the vacuum chamber unit (110), creates plasma composed of ionized gas particles or metal particles, and emits a second ion beam toward the material (10) placed on the station (111) by applying a voltage to the created plasma; and The controller (140) controls operation of the first ion implanter (120) and the second ion implanter (130) such that a complex compound layer including an electric conductive layer is formed while ions are implanted into the surface of the material (10) by emitting both of the first ion beam and the second ion beam or only one ion beam of the first ion beam and the second ion beam. Accordingly, it is possible to implant ions into the surface of the material (10) using the first ion implanter (120) and the second ion implanter (130), so it is possible to reform a surface in various patterns in accordance with the use of materials (10) and it is possible to divide an ion amount-concentrated portion into two parts, whereby entirely uniform reformation can be achieved. Further, the first ion implanter (120) and the second ion implanter (130) are spaced apart from each other and mounted at positions that are point-symmetric to each other at the upper portion of the vacuum chamber unit (110), so it is possible to implant ions toward the material (10) on the station (111) disposed at the center, whereby more uniform surface reformation can be achieved.

Second, the vacuum chamber unit (110) has an inlet gate (113) that opens and closes on a first side and an outlet gate (114) that opens and closes on a second side, the supply chamber (150) has a hermetic internal space (S2), has a supply gate (151) that opens and closes on a first side thereof, and is disposed at a first side position of the vacuum chamber unit (110), and is connected at a second side thereof to the internal space (S1) of the vacuum chamber unit (110) through the inlet gate (113), and the discharge chamber (160) has a hermetic internal space (S3), is disposed at a second side position of the vacuum chamber unit (110), is connected at a first side thereof to the internal space (S1) of the vacuum chamber unit (110) through the outlet gate (114), and has a discharge gate (161) that opens and closes on a second side thereof. Accordingly, the internal space (S1) of the vacuum chamber unit (110) is exposed only to the internal space (S2) of the supply chamber (150) or the internal space (S3) of the discharge chamber (160), so it is possible to greatly reduce the time that is taken to make the internal space (S1) of the vacuum chamber unit (110) into a vacuum state of a desired pressure ($10^{-5}$ torr) after feeding the material (10) into the vacuum chamber unit (110) or taking out the fed material (10), whereby the manufacturing time is reduced and productivity can be increased.

Third, the material conveyer unit (170) includes: a first conveyer (171) that is disposed in the supply chamber (150) and conveys material (10) conveyed through the supply gate (151) and being in a pre-surface reforming state to the inlet gate (113); a second conveyer (172) that is disposed in the vacuum chamber unit (110) and conveys the material (10 conveyed through the inlet gate (113) to the station (111); a third conveyer (173) that is disposed in the vacuum chamber unit (110) and conveys the material (10) in a post-surface reforming state to the outlet gate (114); and a fourth conveyer (174) that is disposed in the discharge chamber (160) and conveys the material (10) conveyed through the outlet gate (114) to the discharge gate (161). Accordingly, it is possible to automate the conveying processes such as feeding and discharging a material into and out of the supply chamber (150), feeding and discharging a material into and out of the vacuum chamber unit (110), and feeding and discharging a material into and out of the discharge chamber (160), so it is possible to further increase productivity.

Fourth, the controller (140) individually controls operation of the supply gate (151), the inlet gate (113), the outlet gate (114), the discharge gate (161), the first conveyer (171), the second conveyer (172), the third conveyer (173), and the fourth conveyer (174) such that a material (10) is conveyed to the inlet gate (113) by the first conveyer (171) by opening the supply gate (151) of the supply chamber (150) with the inlet gate (113) of the vacuum chamber unit (110) closed, a material (10) is conveyed to the station (111) by the second conveyer (172 by opening the inlet gate (113) of the vacuum chamber unit (110) with the supply gate (151) of the supply chamber (150) closed, and a material (10) conveyed to the outlet gate (114) by the third conveyer (173) is conveyed to the discharge gate (161) by the fourth conveyer (174) by opening the outlet gate (114) of the vacuum chamber unit (110) with the inlet gate (113) of the vacuum chamber unit (110) and the discharge gate (161) of the discharge chamber (160) closed. Accordingly, it is possible to achieve an automated process such that the internal space (S1) of the vacuum chamber unit (110) in a vacuum state is exposed only to the internal space (S2) of the supply chamber (150) or the internal space (S3) of the discharge chamber (160 without being exposed to the atmospheric pressure when a material (10) is fed into or discharged out of the vacuum chamber unit (110).

Fifth, the vacuum chamber unit (110) further includes a first pressure adjuster (115) that adjusts the pressure of the internal space (S1), the supply chamber (150) includes a second pressure adjuster (155) that adjusts the pressure of the internal space (S2), the discharge chamber (160) includes a third pressure adjuster (165) that adjusts the pressure of the internal space (S3), and the controller (140) controls operation of the first pressure adjuster (115), the second pressure adjuster (155), and the third pressure adjuster (165) such that the internal space (S1) of the vacuum chamber unit (110) is maintained in vacuum at a first pressure required for creating plasma, and the supply chamber (150) and the discharge chamber (160) are maintained in vacuum at a second pressure relatively lower than the atmospheric pressure and relatively higher than the first pressure. Accordingly, an increase of a vacuum pressure when the inlet gate (113) or the outlet gate (114) of the vacuum chamber unit (110) is opened is minimized, whereby it is possible greatly reduce the time that is taken to make a vacuum state at a desired pressure.

Sixth, the internal space (S2) of the supply chamber (150) and the internal space (S3) of the discharge chamber (160) are relatively smaller in volume than the internal space (S1) of the vacuum chamber unit (110), whereby an increase of a vacuum pressure when the inlet gate (113) or the outlet gate (114) of the vacuum chamber unit (110) is opened is minimized, whereby it is possible greatly reduce the time that is taken to make a vacuum state at a desired pressure.

Seventh, the supply chamber (150) further includes a volume adjuster (156) detachably mounted over the first conveyer (171) in the internal space (S2), and the volume adjuster (156) is mounted in the internal space (S2) such that the volume of the internal space (S2) decreases and the time for the second pressure adjuster (155) to adjust the pressure of the internal space (S2) to the second pressure is reduced, and is separated from the internal space (S2) to expand the space over the first conveyer (171), so that it is possible to convey a material (10) having a relatively large height.

Eighth, a plurality of inlet gates (113) is disposed on the first side of the vacuum chamber unit (110), a plurality of discharge chambers is disposed at the first side position of the vacuum chamber unit (110) and is connected at second sides thereof to the internal space (S1) of the vacuum chamber unit (110) through the inlet gates (113), respectively, a plurality of first conveyers (171) is disposed in the supply chambers (150), respectively, and conveys materials (10) conveyed through the supply gates (151) and being in a pre-surface processing state to the inlet gates (113), respectively, a plurality of second conveyers (172) is disposed in the vacuum chamber unit (110) and conveys the materials (10) conveyed through the inlet gates (113), respectively, to the station (111), and the controller (140) controls operation such that every time a material (10) is conveyed to the vacuum chamber unit (110) from one supply chamber (150), the internal space (S2) of another supply chamber (150) is maintained in vacuum at the second pressure with a material (10) conveyed in the supply chamber (150). Accordingly, it is possible to prevent a situation in which the vacuum chamber unit (110) cannot perform a reforming process and has to stand by for the time that is taken to adjust the internal space (S2) into a vacuum state at the second pressure after a material (10) is fed into the supply chamber (150).

Ninth, the controller (140) individually controls operation of the supply gate (151), the inlet gate (113), the outlet gate (114), the discharge gate (161), the first conveyer (171), the second conveyer (172), the third conveyer (174), the fourth conveyer (174), the first ion implanter (120), and the second ion implanter (130) such that a material (10) is conveyed to the inlet gate (113) by the first conveyer (171) by opening the supply gate (151) of the supply chamber (150) with the internal space (S1) of the vacuum chamber unit (110) maintained in vacuum at the first pressure, a material (10) is conveyed to the station (111) by the second conveyer (172) by opening the inlet gate (113) with the supply gate (151) of the supply chamber (150) closed and the internal space (S2) of the supply chamber (150) maintained in vacuum at the second pressure, a complex compound layer is formed on the surface of a material (10) by a first ion beam and a second ion beam with the inlet gate (113) of the vacuum chamber unit (110) closed and the internal space (S1) of the vacuum chamber unit (110) maintained in vacuum at the first pressure, a material (10) conveyed to the outlet gate (114) by the third conveyer (173) is conveyed to the discharge gate (161) by the fourth conveyer (174) by opening the outlet gate (114) of the vacuum chamber unit (110) with the internal space (S3) of the discharge chamber (160) maintained in vacuum at the second pressure, and the inlet gate (113) of the vacuum chamber unit (110) and the discharge gate (161) of the discharge chamber (160) closed, and the discharge gate (161) of the discharge chamber (160) is opened with the outlet gate (114) of the vacuum chamber unit (110) closed. Accordingly, it is possible to achieve an automated process in a limited state such that the internal space (S1) of the vacuum chamber unit (110) in a vacuum state is exposed only to the internal space (S2) of the supply chamber (150) or the internal space (S3) of the discharge chamber (160) without being exposed to the atmospheric pressure when a material (10) is fed into or discharged out of the vacuum chamber unit (110), and it is possible to greatly reduce the time that is taken to make a vacuum state at a desired pressure by minimizing an increase of a vacuum pressure when the inlet gate (113) or the outlet gate (114) of the vacuum chamber unit (110) is opened.

Tenth, the vacuum chamber unit (110) includes a first vacuum chamber (110*a*) that has an internal space (S1) that is selectively maintained in vacuum, has a station (111) for placing a material (10) in the internal space (S1), has an inlet gate (113) that opens and closes on a first side, and has an intermediate gate (116) that opens and closes on a second side, and a second vacuum chamber (110*b*) that has an internal space (S1) that is selectively maintained in vacuum, has a station (111) for placing a material (10) in the internal space (S1), is disposed at a second side position of the first vacuum chamber (110*a*), is connected at a first side to the internal space (S1) of the first vacuum chamber (110*a*) through the intermediate gate (116), and has an outlet gate (114) that opens and closes on a second side; the discharge chamber (160) has a hermetic internal space (S2), has a supply gate (151) that opens and closes on a first side, and is disposed at a first side position of the first vacuum chamber (110*a*), whereby a second side thereof is connected to the internal space (S1) of the first vacuum chamber (110*a*) through the inlet gate (113); the supply chamber (150) has a hermetic internal space (S3) at a second side position of the second vacuum chamber (110*b*), is connected at a first side thereof to the internal space (S1) of the second vacuum chamber (110*b*) through the outlet gate (114), and has a discharge gate (161) that opens and closes on a second side thereof; the flipper (184) that flips a material (10) that is conveyed from the first vacuum chamber (110*a*) to the second vacuum chamber (110*b*); and The material conveyer unit (170) includes a first conveyer (171) that is disposed in the supply chamber (150) and conveys a material (10) conveyed through the supply gate (151) and being in a pre-surface reforming state to the inlet gate (113), a second conveyer a (172*a*) that is disposed in the first vacuum chamber (110*a* and conveys a material (10) conveyed through the inlet gate (113) to the station (111); a third conveyer a (173*a*) that is disposed in the first vacuum chamber (110*a*) and conveys a material (10) having a first side in a post-surface reforming state to the intermediate gate (116), a second conveyer b (172*b*) that is disposed in the second vacuum chamber (110*b*) and conveys a material (10) conveyed through the intermediate gate (116) to the station (111), a third conveyer b (173*b*) that is disposed in the second vacuum chamber (110*b*) and conveys a material (10) having a second side in a post-surface reforming state to the outlet gate (114), and a fourth conveyer (174) that is disposed in the discharge chamber (160) and conveys a material (10) conveyed through the outlet gate (114) and being in a post-surface reforming state to the discharge gate (161). Accordingly, when it is required to reform the top and the bottom of a material (10), it is possible to automate the entire process of feeding a material (10), reforming the top of the material (10), reforming the bottom of the material (10), and discharging the material (10) after reforming, so productivity can be maximized.

Eleventh, the station (111) on which a material (10) is placed is a stage that can be driven in four or more axial directions for uniform emission on a material (10); when the axial directions constituting the surface of the station (111) are defined as an x axis and a y axis, and the axial direction in the height direction of the station in the vacuum chamber unit (110) is defined as a z axis, the station (111) can be driven in four or more axial directions including linear movement in the x-axial direction, linear movement in the y-axial direction, rotation about the z axis, and rotation about the x axis or the y axis. Accordingly, it is possible to have a uniform ion beam implantation profile of the surface of a material (10). Further, it is possible to implant an ion beam into sides too.

Twelfth, the material heating unit (180) is disposed at positions out of a virtual straight space between the first ion beam emitter (122) and the material (10) and at positions out of a virtual straight space between the second ion beam emitter (132), and is positioned over the station (111) in order not to interfere with emission of an ion beam from the first ion beam emitter (122) of the first ion implanter (120) and emission of an ion beam from the second ion beam emitter (132) of the second ion implanter (130), and heats the material (10) in a non-contact type to be able to control an ion implantation depth of the material (10). Accordingly, it is possible to control the ion implantation depth of a material (10) by controlling the non-contact type material heating unit.

Thirteenth, the material cooling unit (190) is disposed at positions out of a virtual straight space between the first ion beam emitter (122) and the material (10) and at positions out of a virtual straight space between the second ion beam emitter (132), and is positioned over the station (111) in order not to interfere with emission of an ion beam from the first ion beam emitter (122) and emission of an ion beam from the second ion beam emitter (132), and cools the material (10) in a non-contact type. It is possible to prevent discoloring or yellowing of a material (10) by controlling the material cooling unit in a non-contact type. Further, the material cooling unit (190) cools the surface of a material (10) in order to be able to prevent discoloring or yellowing of the material due to quality of heat that is generated by ion implantation, whereby it is possible to maintain the original transparency or color of a material (10) and prevent discoloring or yellowing of the surface of the material (10).

Fourteenth, in order to accurately control the material heating unit (180) and the material cooling unit (190), one or more temperature sensors (141 that can measure a temperature in close contact with a side of a material (10) are inserted in the station (111), and if necessary, the temperature sensors (141) are protruded perpendicular to the plane of the station (111) on which a material (10) is placed, thereby measuring a temperature in close contact with a side of the material (10), in which it is possible to transmit a measurement value of the temperature sensor (141) in a wireless type so that the controller (140) can receive the measurement value of the temperature sensor (141) even though the station (111) is controlled with respect to four or more axes. Accordingly, more precise control is possible by controlling the material heating unit and the material cooling unit in real time using the wireless type temperature sensor 141.

Fifteenth, when metal targets that are supplied to the first target provider (125) or the second target provider (135) are n (here, n is a natural number over 2) metal targets and volume ratios calculated in consideration of the atomic weight of the n metal targets are the same, the metal targets are manufactured in a circular shape such that the n metal targets are uniformly distributed and the first plasma or the second plasma is uniformly formed and distributed. Further, metal targets are divided into nk (k is a natural number) angles of the circle, in which the first, second, . . . n-th divided fan-shaped sections are n different metal targets, the (n+1)-th, (n+2)-th, . . . 2n-th divided fan-shaped sections are n different metal targets, and (n(k−1)+1)-th, (n(k−1)+2)-th, and nk-th divided fan-shaped sections are n different metal targets. Accordingly, the circular metal targets have uniform distributions, which contributes to uniform forming of first plasma or second plasma.

Sixteenth, unlike glass film coating that takes over 3 hours in the related art, it is possible to perform glass film coating within 30 minutes by using the apparatus according to the present disclosure.

Seventeenth, when the glass film coating according to the present disclosure is applied to the folding portion of recent foldable smartphones, it is possible to greatly improve durability or hydrophobicity of the polymer on the display of the smartphones.

DETAILED DESCRIPTION OF THE INVENTION

Hereinafter, preferred embodiments of the present disclosure will be described with reference to accompanying drawings. The terms and words used in the present specification and claims should not be interpreted as being limited to typical meanings or dictionary definitions, but should be interpreted as having meanings and concepts relevant to the technical scope of the present disclosure based on the rule according to which an inventor can appropriately define the concept of the term to describe most appropriately the best method he or she knows for carrying out the invention.

Therefore, the configurations described in the embodiments and drawings of the present disclosure are merely most preferred embodiments but do not represent all of the technical spirit of the present invention. Thus, it should be understood that the present disclosure should be construed as including all the changes, equivalents, and substitutions included in the spirit and scope of the present disclosure at the time of filing this application.

(Material Surface Reforming Apparatus Using Ion Implantation)

First, the configuration and function of a material surface reforming apparatus using ion implantation according to a preferred embodiment of the present disclosure are described.

Figure 1:
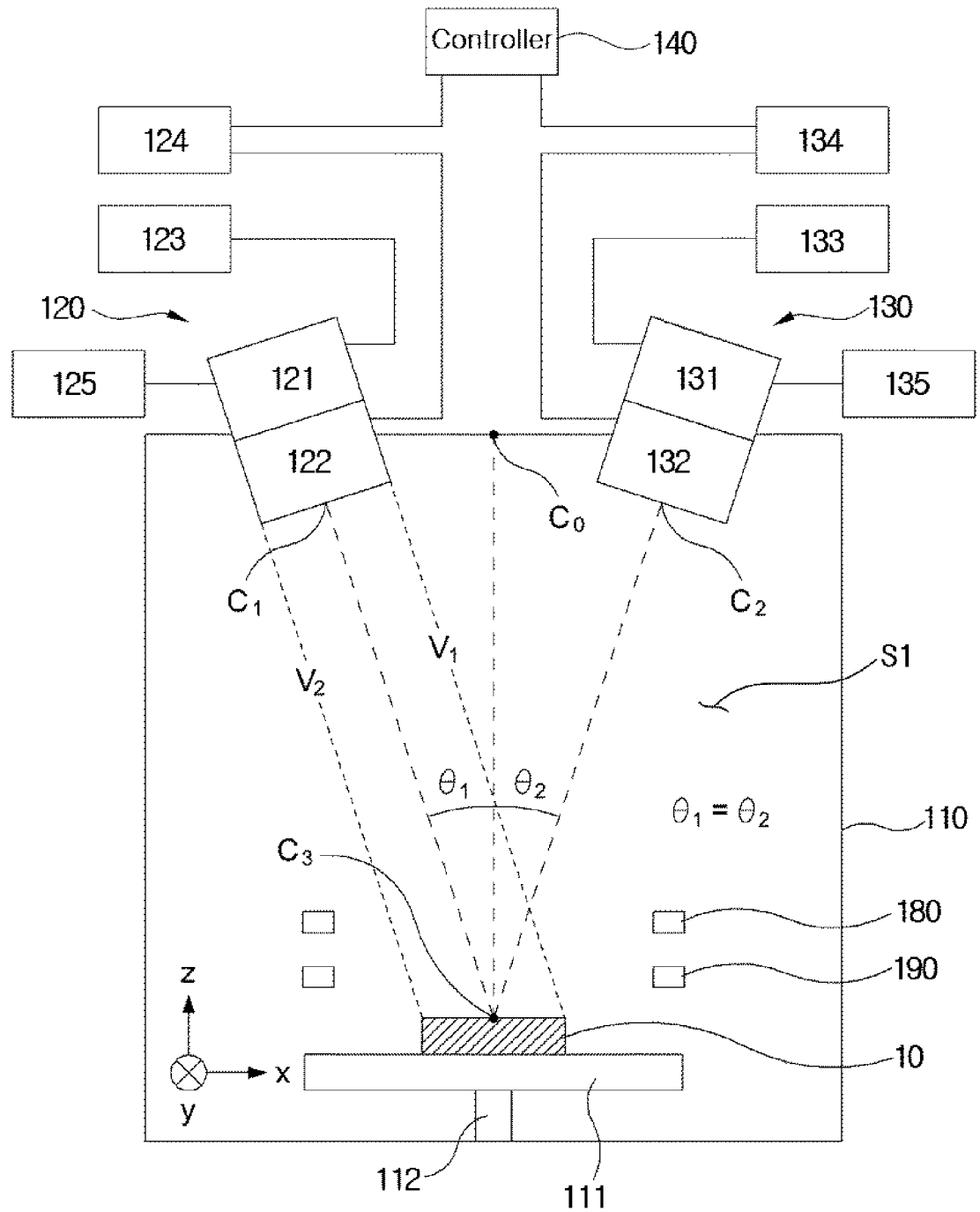
FIG. 1 is a schematic view showing the configuration of a material surface reforming apparatus using ion implantation according to a preferred embodiment of the present disclosure.

A material surface reforming apparatus using ion implantation according to a preferred embodiment of the present disclosure, which is an apparatus that can reform a surface in various patterns in accordance with the use of materials because it is possible to implant ions into the surface of a material using a first ion implanter and a second ion implanter, and that can achieve uniform reforming throughout the entire because it is possible to divide an ion amount concentration portion into two parts, as shown in FIG. 1, includes a vacuum chamber unit 110, a first ion implanter 120, a second ion implanter 130, and a controller 140.

First, the vacuum chamber unit 110, which is a chamber that provides a space in which a reforming process is performed, has an internal space S1 in which vacuum is selectively maintained, and a station 111 for placing a material 10 that is a surface reforming target is disposed in the internal space S1.

In this case, an example in which one material 10 is disposed on one station 111 is exemplified in the figure, one or a plurality of materials 10 may be disposed on a plurality of stations 111. Further, it is preferable that the vacuum chamber unit 110 is provided such that vacuum of a first pressure (e.g., $10^{-5}$ torr) set such that plasma can be created and ion beams can be emitted by the first ion implanter 120 or the second ion implanter 130 can be generated.

The first ion implanter 120 and the second ion implanter 130 are components that provide ion beams for reforming the surface of a material 10 placed on the station 10. The first ion implanter 120 is mounted at the upper portion of the vacuum chamber unit 110, creates plasma composed of ionized gas particles (gas atoms or gas molecules) or metal particles (metal atoms or metal molecules), and emits a first ion beam toward the material 10 placed on the station 11 by applying a voltage to the created plasma.

To this end, as shown in FIG. 1, the first ion implanter 120 includes a first ion generator 121, a first ion beam emitter 122, a first plasma power source 123, and a first ion beam emission power source 124.

The first ion generator 121 is provided with gas or metal from the first target provider 125 and separates electrons by hitting thermal electrons against gas particles or metal particles or using microwaves, thereby forming first plasma composed of ionized gas particles or ionized metal particles.

The first ion beam emitter 122 implants first ions into the surface of the material 10 while emitting an ion beam by applying a voltage over 5~200 kV to the first plasma created by the first ion generator 121. It is preferable that the voltage is relatively lower than a voltage at which a nuclear reaction occurs in the material 10 by implanting the voltage ion beam.

The first plasma power source 123 supplies driving power for driving the first ion generator 121 and the first ion beam emission power source 124 supplies driving power for driving the first ion beam emitter 122.

The first ion implanter 120 implants a first ion beam such that the molecular chains of the material 10 are cut or double bonding is made by ion implantation and a complex compound layer including an electric conductive layer is formed on the surface of the material 10.

The second ion implanter 130 is mounted at the upper portion of the vacuum chamber unit 110, creates plasma composed of ionized gas particles or metal particles, and emits a second ion beam toward the material 10 placed on the station 111 by applying a voltage to the created plasma.

To this end, as shown in FIG. 1, the second ion implanter 130 includes a second ion generator 131, a second ion beam emitter 132, a second plasma power source 133, and a second ion beam emission power source 134.

The second ion generator 131 is provided with gas or metal from the second target provider 135 and separates electrons by hitting thermal electrons against gas particles or metal particles or using microwaves, thereby forming second plasma composed of ionized gas particles or ionized metal particles.

The second ion beam emitter 132 implants first ions into the surface of the material 10 while emitting an ion beam by applying a voltage over 5~200 kV to the second plasma created by the second ion generator 131. It is preferable that the voltage is relatively lower than a voltage at which a nuclear reaction occurs in the material 10 by implanting the voltage ion beam.

The second plasma power source 133 supplies driving power for driving the second ion generator 131 and the second ion beam emission power source 134 supplies driving power for driving the second ion beam emitter 132.

The second ion implanter 130 implants a second ion beam such that the molecular chains of the material 10 are cut or made into double bonding by ion implantation and a complex compound layer including an electric conductive layer is formed on the surface of the material 10.

It is possible to form a high-functional compound layer by complexly implanting ions like "gas ion beam+metal ion beam", "metal ion beam+metal ion beam", or "gas ion beam+gas ion beam" through a plurality of ion implanters 120 and 130. In this case, an ion beam is emitted by applying a voltage of 5~200 kV to plasma, and as a voltage increases, gas and metal plasma are accelerated and the thickness of the compound layer on the surface of the material 10 increases. Herein, it is possible to implant the first ion implanter 120 and the second ion implanter 130 using a Lisitano coil antenna.

The controller 140 controls operation of the first ion implanter 120 and the second ion implanter 130 such that a complex compound layer including an electric conductive layer is formed while ions are implanted into the surface of the material 10 by emitting both of the first ion beam and the second ion beam or only one ion beam of the first ion beam and the second ion beam.

Here, the controller 140 can adjust the thickness or pattern of the complex compound layer that is formed while the surface of the material 10 is reformed, by individually or generally controlling operation of the first ion implanter 120 and the second ion implanter 130.

It is possible to implant ions into the surface of the material 10 using the first ion implanter 120 and the second ion implanter 130 due to the combined configuration of the vacuum chamber unit 110, the first ion implanter 120, the second ion implanter 130, and the controller 140, so it is possible to reform a surface in various patterns in accordance with the use of materials 10 and it is possible to divide an ion amount-concentrated portion into two parts, whereby entirely uniform reformation can be achieved.

Further, as show in FIG. 1, the first ion implanter 120 and the second ion implanter 130 are spaced apart from each other and mounted at positions that are point-symmetric to each other at the upper portion of the vacuum chamber unit 110, so it is possible to implant ions toward the material 10 on the station 111 disposed at the center, whereby more uniform surface reformation can be achieved.

Meanwhile, as for the vacuum chamber unit 110, the internal space S1 should be maintained in a set high vacuum state to reform the surface of the material, but when the material before the surface is reformed is fed into the vacuum chamber unit 110 or the material 10 after the surface is reformed is taken out of the vacuum chamber unit 110, the internal space S1 is exposed to the atmospheric pressure through an entrance (not shown), so it is required to frequently adjust a pressure to the first set pressure (e.g., $10^{-5}$ torr) from the atmospheric pressure in order to repeatedly perform a surface reformation process.

Accordingly, in the material surface reforming apparatus using ion implantation according to a preferred embodiment of the present disclosure, a supply chamber 150 and a discharge chamber 160 may be provided to minimize a pressure adjustment range for reaching the first pressure for a surface reformation process.

Figure 2:
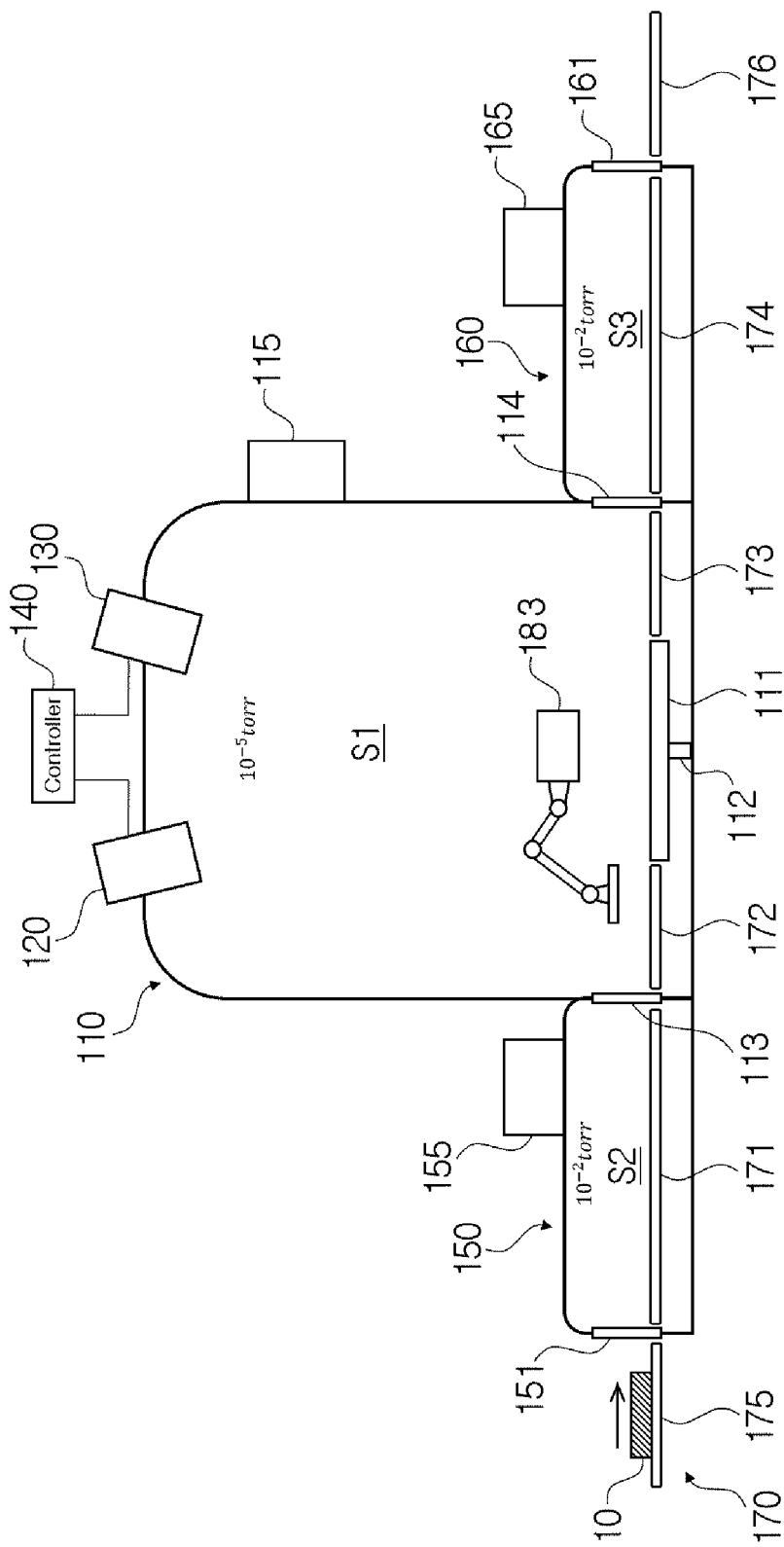
FIG. 2 is a schematic view showing the configuration in which a supply chamber and a discharge chamber are disposed at both sides of a vacuum chamber unit according to a preferred embodiment of the present disclosure.

To this end, as shown in FIG. 2, the vacuum chamber unit 10 has an inlet gate 113 that opens and closes on a first side and an outlet gate 114 that opens and closes on a second side.

The supply chamber 150 has a hermetic internal space S2, has a supply gate 151 that opens and closes on a first side thereof, and is disposed at a first side position of the vacuum chamber unit 110, and is connected at a second side thereof to the internal space S1 of the vacuum chamber unit 110 through the inlet gate 113.

The discharge chamber 160 has a hermetic internal space S3, is disposed at a second side position of the vacuum chamber unit 110, is connected at a first side thereof to the internal space S1 of the vacuum chamber unit 110 through the outlet gate 114, and has a discharge gate 161 that opens and closes on a second side thereof.

Accordingly, the internal space S1 of the vacuum chamber unit 110 is exposed only to the internal space S2 of the supply chamber 150 or the internal space S3 of the discharge chamber 160, so it is possible to greatly reduce the time that is taken to make the internal space S1 of the vacuum chamber unit 110 into a vacuum state of a desired pressure (105 torr) after feeding the material 10 into the vacuum chamber unit 110 or taking out the fed material 10, whereby the manufacturing time is reduced and productivity can be increased.

Further, it is possible to automate the process of conveying the material 10 through a material conveyer unit 170 having a plurality of conveyers.

In more detail, the material conveyer unit 170 may include: a first conveyer 171 that is disposed in the supply chamber 150 and conveys a material 10 conveyed through the supply gate 151 and being in a pre-surface processing state to the inlet gate 113; a second conveyer 172 that is disposed in the vacuum chamber unit 110 and conveys the material 10 conveyed through the inlet gate 113 to the station 111; a third conveyer 173 that is disposed in the vacuum chamber unit 110 and conveys the material 10 in a post-surface processing state to the outlet gate 114; and a fourth conveyer 174 that is disposed in the discharge chamber 160 and conveys the material 10 conveyed through the outlet gate 114 to the discharge gate 161.

A loader 183 for loading a conveyed material 10 onto the station 111 may be disposed in the vacuum chamber unit 110. The loader 183 may be formed in a robot arm structure and other various structures for moving members in the automation technology field may be applied.

Accordingly, it is possible to automate the conveying processes such as feeding and discharging a material into and out of the supply chamber 150, feeding and discharging a material into and out of the vacuum chamber unit 110, and feeding and discharging a material into and out of the discharge chamber 160, so it is possible to further increase productivity.

Further, the material conveyer unit 170 further includes a fifth conveyer 175 that conveys a material 10 supplied from the outside to the supply gate 151 of the supply chamber 150 and a sixth conveyer 176 that conveys a material 10 conveyed through the discharge gate 161 to the outside, so it is possible to automate even the process of conveying a material 10 to the supply chamber 150 from the outside and the process of conveying a material 10 discharged from the discharge chamber 160.

Further, it is preferable that the controller 140 individually controls operation of the supply gate 151, the inlet gate 113, the outlet gate 114, the discharge gate 161, the first conveyer 171, the second conveyer 172, the third conveyer 173, and the fourth conveyer 174 such that a material 10 is conveyed to the inlet gate 113 by the first conveyer 171 by opening the supply gate 151 of the supply chamber 150 with the inlet gate 113 of the vacuum chamber unit 110 closed, a material 10 is conveyed to the station 111 by the second conveyer 172 by opening the inlet gate 113 of the vacuum chamber unit 110 with the supply gate 151 of the supply chamber 150 closed, and a material 10 conveyed to the outlet gate 114 by the third conveyer 173 is conveyed to the discharge gate 161 by the fourth conveyer 174 by opening the outlet gate 114 of the vacuum chamber unit 110 with the inlet gate 113 of the vacuum chamber unit 110 and the discharge gate 161 of the discharge chamber 160 closed.

Accordingly, it is possible to achieve an automated process such that the internal space S1 of the vacuum chamber unit 110 in a vacuum state is exposed only to the internal space S2 of the supply chamber 150 or the internal space S3 of the discharge chamber 160 without being exposed to the atmospheric pressure when a material 10 is fed into or discharged out of the vacuum chamber unit 110.

Further, as shown in FIG. 2, the vacuum chamber unit 110 may further include a first pressure adjuster 115 that adjusts the pressure of the internal space S1, the supply chamber 150 may include a second pressure adjuster 155 that adjusts the pressure of the internal space S2, and the discharge chamber 160 may include a third pressure adjuster 165 that adjusts the pressure of the internal space S3.

Further, the controller 140 can control operation of the first pressure adjuster 115, the second pressure adjuster 155, and the third pressure adjuster 165 such that the internal space S1 of the vacuum chamber unit 110 is maintained in vacuum at a first pressure required for creating plasma, and the supply chamber 150 and the discharge chamber 160 are maintained in vacuum at a second pressure relatively lower than the atmospheric pressure and relatively higher than the first pressure. Accordingly, an increase of a vacuum pressure when the inlet gate 113 or the outlet gate 114 of the vacuum chamber unit 110 is opened is minimized, whereby it is possible to greatly reduce the time that is taken to make a vacuum state at a desired pressure.

Further, as in the figure, the internal space S2 of the supply chamber 150 and the internal space S3 of the discharge chamber 160 are relatively smaller in volume than the internal space S1 of the vacuum chamber unit 110, whereby an increase of a vacuum pressure when the inlet gate 113 or the outlet gate 114 of the vacuum chamber unit 110 is opened is minimized, whereby it is possible to greatly reduce the time that is taken to make a vacuum state at a desired pressure.

Meanwhile, materials 10 necessarily have various heights, depending on the kinds or the dimensions of the materials 10 and the supply chamber 150 should be manufactured in a size that enables a material 10 having the largest height to be accommodated in the internal space S2 so that the supply chamber 150 can be generally used for materials 10 having different heights.

However, when a material 10 having a relatively small height is fed into the discharge chamber 150 manufactured on the basis of a material 10 having the largest height, as described above, the volume of the empty space of the internal space S2 increases, so it takes unavoidably long time to adjust the internal space S2 to a set second pressure.

Figure 3:
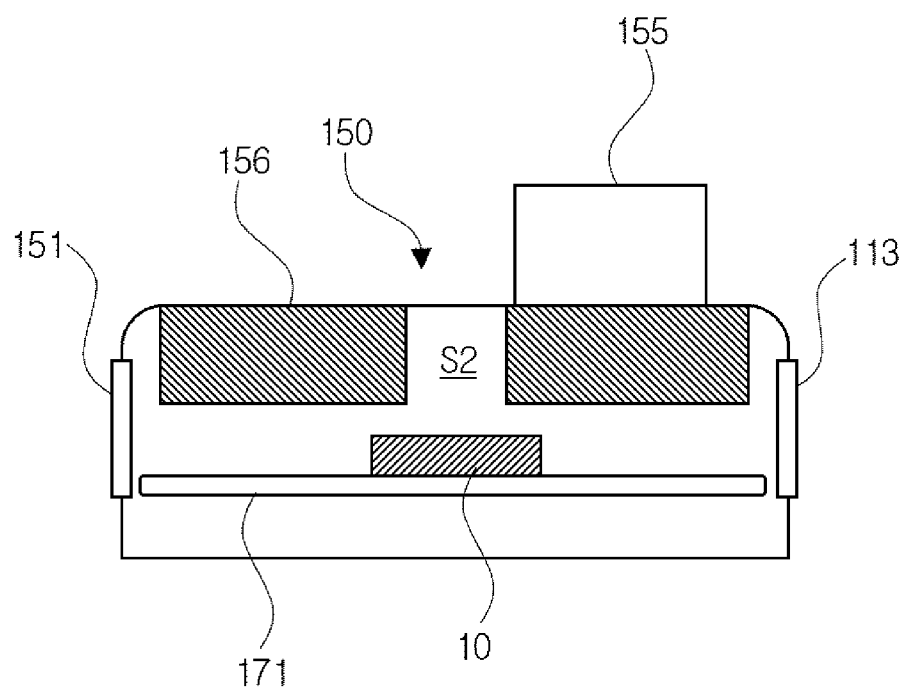
FIG. 3 is a schematic view showing the state in which a volume adjuster according to a preferred embodiment of the present disclosure is mounted in the supply chamber.

Accordingly, as shown in FIG. 3, the supply chamber 150 may further include a volume adjuster 156 detachably mounted over the first conveyer 171 in the internal space S2.

The volume adjuster 156 is mounted in the internal space S2 such that the volume of the internal space S2 decreases and the time for the second pressure adjuster 155 to adjust the pressure of the internal space S2 to the second pressure is reduced. For example, when a material 10 having a relatively small height is fed into the supply chamber 150, it is possible to mount the volume adjuster 156 and reduce the time that is taken to adjust pressure to the second pressure by the volume occupied by the volume adjuster 156.

Further, while the volume adjuster 156 is separated from the internal space S2 to expand the space over the first conveyer 171 such that it is possible to convey a material 10 having a relatively large height. When a For example, material 10 having a relatively large height is fed into the supply chamber 150, it is possible to secure a conveyance space such that the material 10 is not interfered with by the volume adjuster 156 during conveying by separating the volume adjuster 156 from the supply chamber 150.

Figure 4:
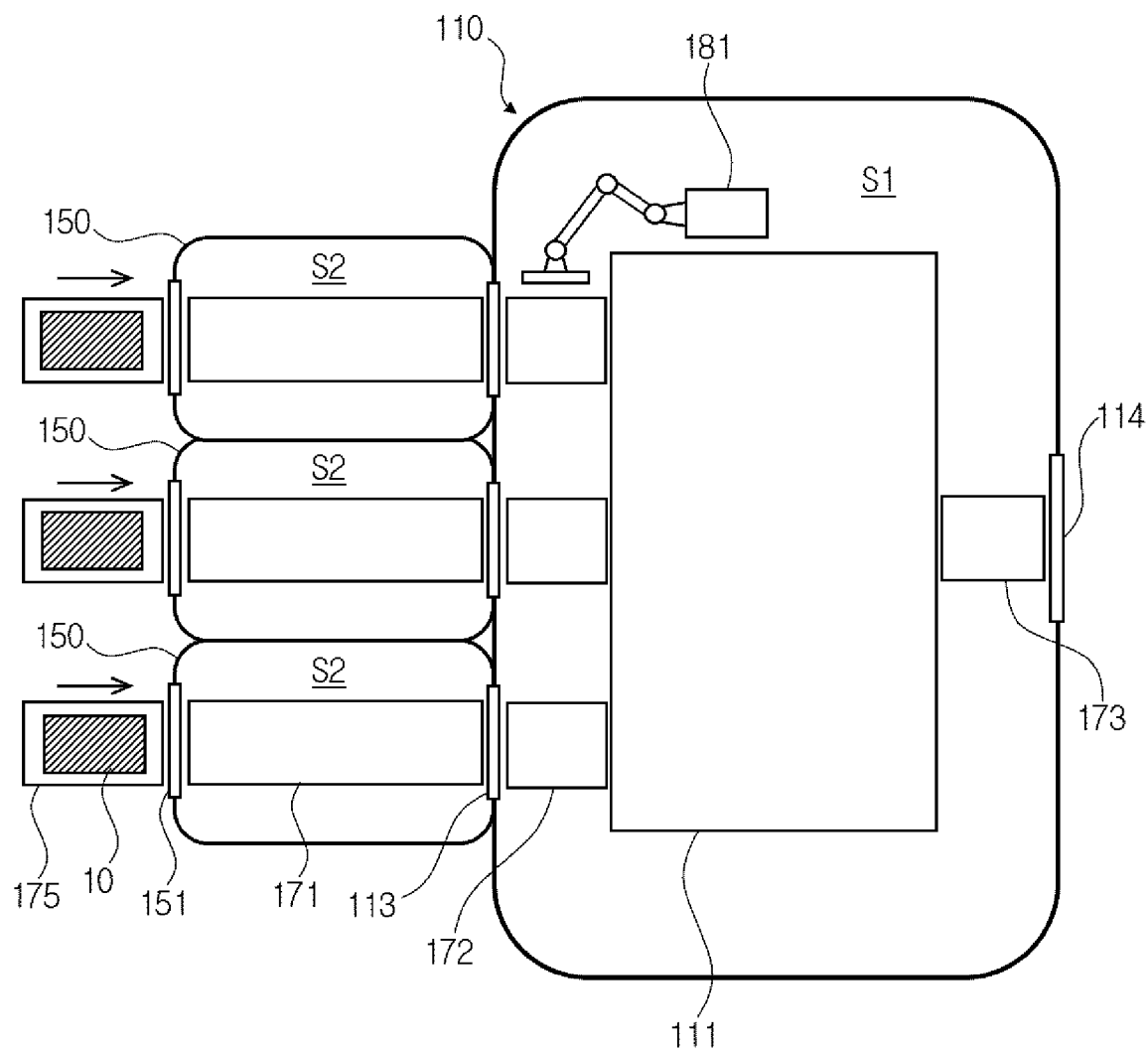
FIG. 4 is a plan view showing the state in which a plurality of supply chambers is connected to the vacuum chamber unit according to a preferred embodiment of the present disclosure.

Further, as shown in FIG. 4, a plurality of inlet gates 113 may be disposed on the first side of the vacuum chamber unit 110; a plurality of supply chambers 150 may be disposed at the first side position of the vacuum chamber unit 110 and connected at second sides thereof to the internal space S1 of the vacuum chamber unit 110 through the inlet gates 113, respectively; a plurality of first conveyers 171 may be disposed in the supply chambers 150, respectively, and may convey materials 10 conveyed through the supply gates 151 and being in a pre-surface processing state to the inlet gates 113, respectively; a plurality of second conveyers 172 may be disposed in the vacuum chamber unit 110 and may convey the materials 10 conveyed through the inlet gates 113, respectively, to the station 111; and the controller 140 may control operation such that every time a material 10 is conveyed to the vacuum chamber unit 110 from one supply chamber 150, the internal space S2 of another supply chamber 150 is maintained in vacuum at the second pressure with a material 10 conveyed in the supply chamber 150.

Accordingly, it is possible to prevent a situation in which the vacuum chamber unit 110 cannot perform a reforming process and has to stand by for the time that is taken to adjust the internal space S2 into a vacuum state at the second pressure after a material 10 is fed into the supply chamber 150.

Further, the controller 140 can perform control such that a material 10 is conveyed to the inlet gate 113 by the first conveyer 171 by opening the supply gate 151 of the supply chamber 150 with the internal space S1 of the vacuum chamber unit 110 maintained in vacuum at the first pressure, and a material 10 is conveyed to the station 111 by the second conveyer 172 by opening the inlet gate 113 with the supply gate 151 of the supply chamber 150 closed and the internal space S2 of the supply chamber 150 maintained in vacuum at the second pressure.

Further, the controller 140 can individually control operation of the supply gate 151, the inlet gate 113, the outlet gate 114, the discharge gate 161, the first conveyer 171, the second conveyer 172, the third conveyer 174, the fourth conveyer 174, the first ion implanter 120, and the second ion implanter 130 such that a complex compound layer is formed on the surface of a material 10 by a first ion beam and a second ion beam with the inlet gate 113 of the vacuum chamber unit 110 closed and the internal space S1 of the vacuum chamber unit 110 maintained in vacuum at the first pressure, a material 10 conveyed to the outlet gate 114 by the third conveyer 173 is conveyed to the discharge gate 161 by the fourth conveyer 174 by opening the outlet gate 114 of the vacuum chamber unit 110 with the internal space S3 of the discharge chamber 160 maintained in vacuum at the second pressure, and the inlet gate 113 of the vacuum chamber unit 110 and the discharge gate 161 of the discharge chamber 160 closed, and the discharge gate 161 of the discharge chamber 160 is opened with the outlet gate 114 of the vacuum chamber unit 110 closed.

As described above, it is possible to achieve an automated process in a limited state such that the internal space S1 of the vacuum chamber unit 110 in a vacuum state is exposed only to the internal space S2 of the supply chamber 150 or the internal space S3 of the discharge chamber 160 without being exposed to the atmospheric pressure when a material 10 is fed into or discharged out of the vacuum chamber unit 110, and it is possible to greatly reduce the time that is taken to make a vacuum state at a desired pressure by minimizing an increase of a vacuum pressure when the inlet gate 113 or the outlet gate 114 of the vacuum chamber unit 110 is opened.

Meanwhile, when it is required to reform the top and the bottom of a material 10, a process of feeding and discharging the material 10 into and out of the discharge chamber 16, the vacuum chamber unit 110, and the discharge chamber 160 should be performed twice.

Figure 5:
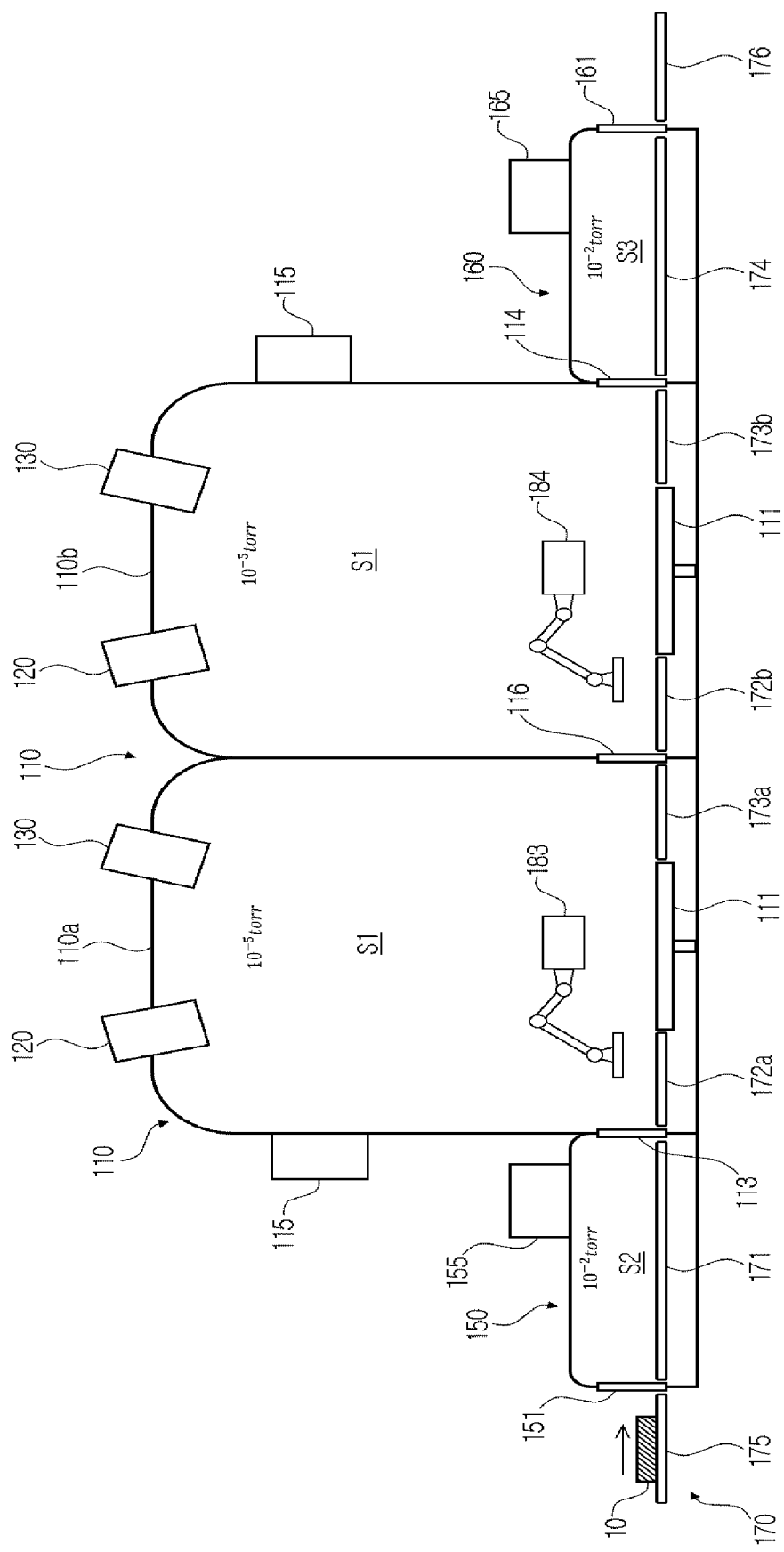
FIG. 5 is a schematic view showing the configuration in which the vacuum chamber unit according to a preferred embodiment of the present disclosure includes a first vacuum chamber and a second vacuum chamber.

Accordingly, the vacuum chamber unit 110 according to a preferred embodiment of the present disclosure includes, as shown in FIG. 5, a first vacuum chamber 110a that has an internal space S1 that is selectively maintained in vacuum, has a station 111 for placing a material 10 in the internal space S1, has an inlet gate 113 that opens and closes on a first side, and has an intermediate gate 116 that opens and closes on a second side; and a second vacuum chamber 110b that has an internal space S1 that is selectively maintained in vacuum, has a station 111 for placing a material 10 in the internal space S1, is disposed at a second side position of the first vacuum chamber 110a, is connected at a first side to the internal space S1 of the first vacuum chamber 110a through the intermediate gate 116, and has an outlet gate 114 that opens and closes on a second side.

In this configuration, the discharge chamber 160 has a hermetic internal space S2, has a supply gate 151 that opens and closes on a first side, and is disposed at a first side position of the first vacuum chamber 110a, whereby a second side thereof is connected to the internal space S1 of the first vacuum chamber 110a through the inlet gate 113.

Further, the supply chamber 150 has a hermetic internal space S3 at a second side position of the second vacuum chamber 110b, is connected at a first side thereof to the internal space S1 of the second vacuum chamber 110b through the outlet gate 114, and has a discharge gate 161 that opens and closes on a second side thereof.

Further, a flipper 184 that flips a material 10 that is conveyed from the first vacuum chamber 110a to the second vacuum chamber 110b is provided. The flipper 184, as in figures, may be formed in a robot arm structure and can flip a material 10, which is conveyed on the conveyers, such that the top faces down by turning the material 10 180 degrees. The flipper 184 may be formed in the same configuration as the loader 183 that loads a material 10 onto the station 110, and if necessary, may be individually configured.

The material conveyer unit 170 includes: a first conveyer 171 that is disposed in the supply chamber 150 and conveys a material 10 conveyed through the supply gate 151 and being in a pre-surface processing state to the inlet gate 113; a second conveyer a 172a that is disposed in the first vacuum chamber 110a and conveys a material 10 conveyed through the inlet gate 113 to the station 111; a third conveyer a 173a that is disposed in the first vacuum chamber 110a and conveys a material 10 having a first side in a post-surface processing state to the intermediate gate 116; a second conveyer b 172b that is disposed in the second vacuum chamber 110b and conveys a material 10 conveyed through the intermediate gate 116 to the station 111; a third conveyer b 173b that is disposed in the second vacuum chamber 110b and conveys a material 10 having a second side in a post-surface processing state to the outlet gate 114; and a fourth conveyer 174 that is disposed in the discharge chamber 160 and conveys a material 10 conveyed through the outlet gate 114 and being in a post-surface processing state to the discharge gate 161.

Accordingly, when it is required to reform the top and the bottom of a material 10, it is possible to automate the entire process of feeding a material 10, reforming the top of the material 10, reforming the bottom of the material 10, and discharging the material 10 after reforming, so productivity can be maximized.

Meanwhile, when a target that is supplied to the first target provider 125 or the second target provider 135 of the present disclosure is a metal target (the metal target can be manufactured and used in an alloy type (CrNi, WC, etc.) in addition to pure metal), it is possible to contribute to producing first plasma or second plasma by making a circular metal target have uniform distribution. When pure metal is a metal target, the entire circle can be made of only pure metal.

Figure 11:
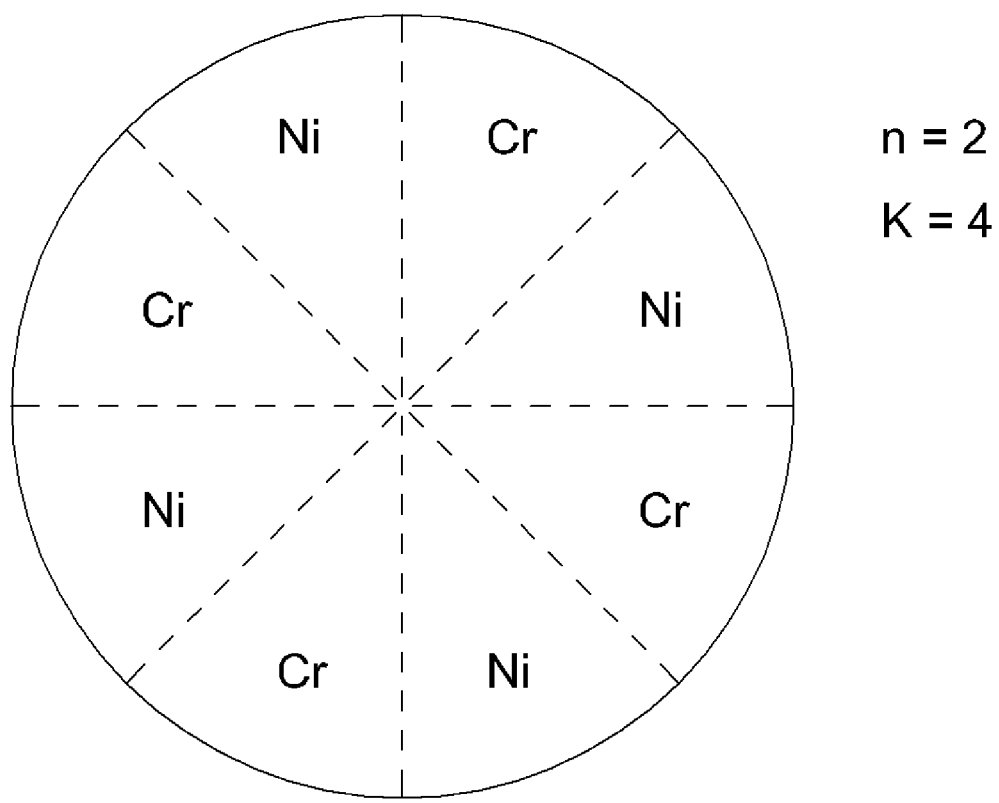
FIG. 11 is a schematic view showing a first target provider according to a preferred embodiment of the present disclosure and a metal target that is supplied to the first target provider.

Further, FIG. 11 schematically shows another example in which when two different metals (n=2) are divided into eight sections (k=4, nk=8), a circular metal target has uniform distribution. FIG. 11 shows the case in which the volume ratio of metals is 1:1, and when the ratio is 1:m, it is required to adjust an angle in accordance with the ratio. When the volume ratio of metals is 1:m, it is apparent that the weight ratio may not be 1:m, considering the atomic weight or the molecular weight.

Next, the vacuum chamber unit 110 includes the station 111, a material 10 is placed on the station 111, and a beam of the first ions or a beam of the second ions described above is implanted, so the molecular chain of the material 10 is cut or double bonding is made by ion implantation, so a complex compound layer including an electric conductive layer is formed on the surface of the material 10. The term "complex" includes at least six or more, that is, a plurality of ion generators, so a complex compound layer is formed on the surface of the material 10.

Further, it is preferable that the station 111 on which a material 10 is placed is a stage that can be driven in four or more axial directions for uniform emission on a material 10. As shown in FIGS. 1 to 7, the axial directions constituting the surface of the station 111 (which is an upper surface or a lower surface, and the upper surface and the lower surface of the material are in the same plane when they are parallel) are defined as an x axis and a y axis, and the axial direction in the height direction of the station in the vacuum chamber unit 110 is defined as a z axis.

In this case, it is preferable that the station 111 can be 4-axially driven including (1) linear movement in the x-axial direction, (2) linear movement in the y-axial direction, (3) rotation about the z axis (rotation of the station 111 from the x-axial direction to the y-axial direction), and (4) rotation about the x axis (rotation of the station 111 from the y-axial direction to the z-axial direction) or rotation about the y axis (rotation of the station 111 from the x-axial direction to the z-axial direction).

Figure 8:
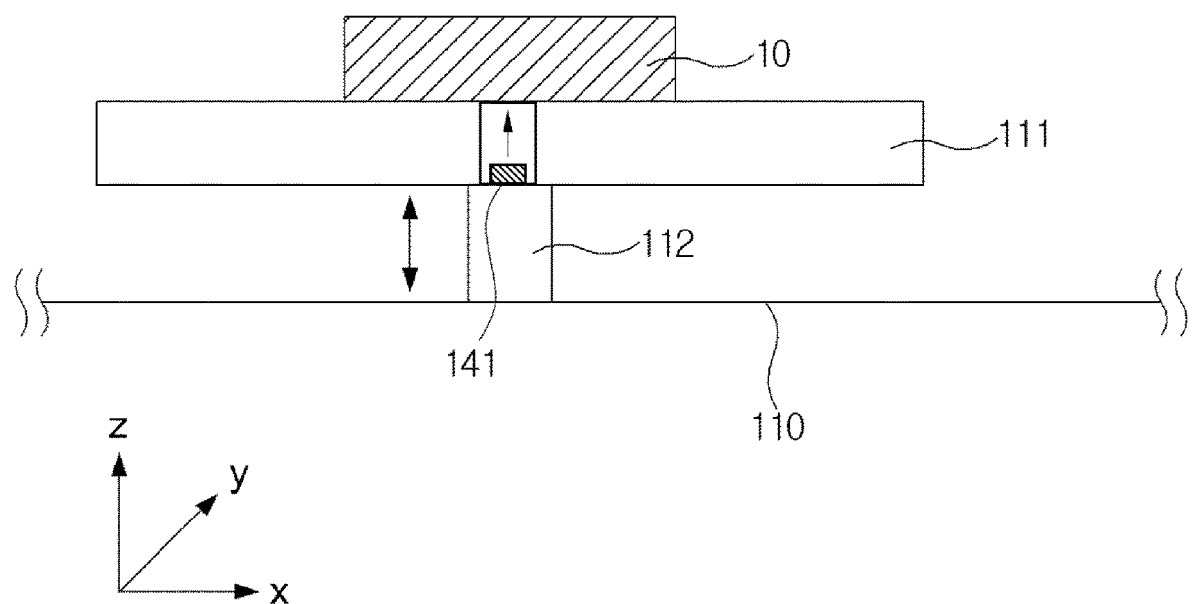
FIG. 8 is a schematic view showing the configuration in which the height of a station is adjusted by a height adjuster according to a preferred embodiment of the present disclosure.

Further, a height adjuster 112 that adjusts the height of the station 111 in the z-axial direction may be further included. For reference, FIG. 8 schematically shows notation of the directions stated in the specification and the claims and the height adjuster 112 that adjusts the height of the station 111 in the z-axial direction in an apparatus for forming a high-functional compound layer on the surface of a material 10 using ion implantation according to a preferred embodiment of the present disclosure.

Meanwhile, as shown in FIG. 1, when the center of the top of the vacuum chamber unit 110 is $C_0$, the center of the bottom of the first ion beam emitter 122 is $C_1$, the center of the bottom of the second ion beam emitter 132 is $C_2$, the center of the surface of a material 10 is $C_3$, $\angle C_1 C_3 C_0$ is $\theta_1$, and $\angle C_2 C_3 C_0$ is $\theta_2$, the controller rotates the station 111 by $\theta_1$ counterclockwise about the y axis when first ions are implanted. As a result, a straight line connecting the center $C_1$ of the bottom of the first ion beam emitter 122 and the center $C_3$ of the surface of a material 10 to each other is perpendicular to the bottom of the first ion beam emitter 122 and perpendicular to the surface plane of the material 10 too, whereby an ion beam implantation profile of the first ion beam emitter 122 can be uniformly applied to the surface of the material 10.

Meanwhile, when second ions are implanted, the station 111 is controlled to rotate by $\theta_2$ clockwise about the y axis. Similarly, a straight line connecting the center $C_2$ of the bottom of the second ion beam emitter 132 and the center $C_3$ of the surface of a material 10 to each other is perpendicular to the bottom of the second ion beam emitter 132 and perpendicular to the surface plane of the material 10 too, whereby an ion beam implantation profile of the second ion beam emitter 132 can be uniformly applied to the surface of the material 10.

Figure 9:
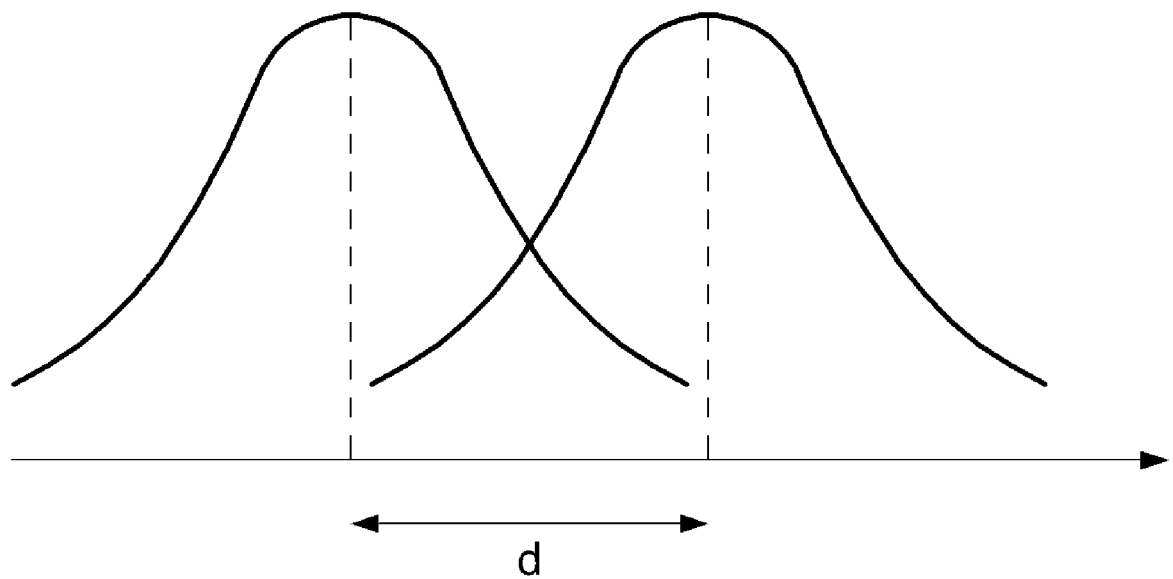
FIG. 9 is a graph schematically showing two ion beam implantation profiles before and after beams emitted from a first ion beam emitter and a second ion beam emitter according to a preferred embodiment of the present disclosure are moved by 3 in the x-axial or y-axial direction.
Figure 10:
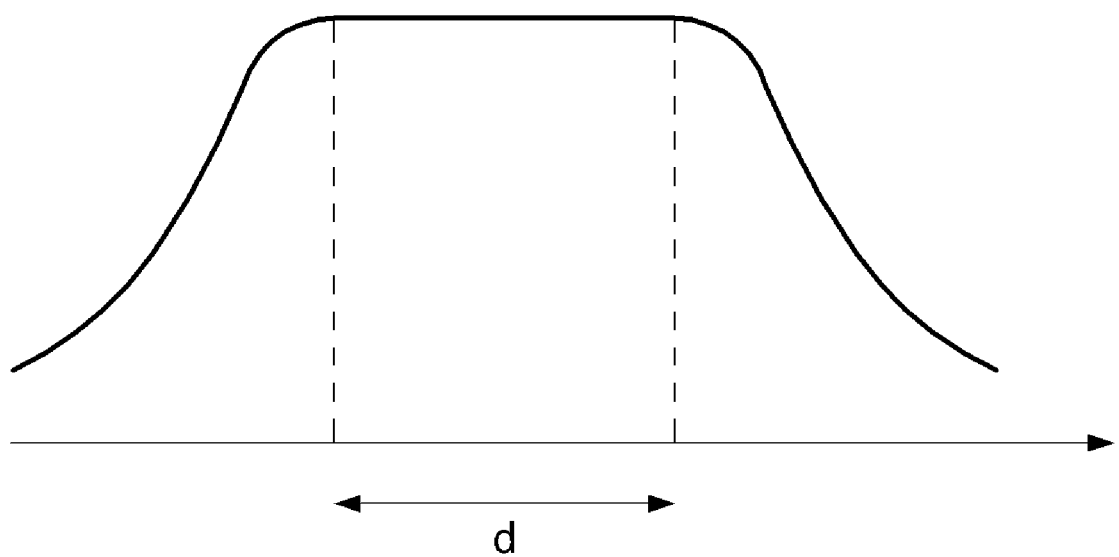
FIG. 10 is a graph schematically showing a combined ion beam implantation profile when overlapping two ion beam implantation profiles before and after beams emitted from the first ion beam emitter and the second ion beam emitter according to a preferred embodiment of the present disclosure are moved by 3 in the x-axial or y-axial direction.

FIG. 9 schematically shows two ion beam implantation profiles before and after beams emitted from the first ion beam emitter 122 and the second ion beam emitter 132 are moved by d in the x-axial or y-axial direction in the apparatus for forming a high-functional complex compound layer on the surface of a material 10 using ion implantation according to a preferred embodiment of the present disclosure; and FIG. 10 schematically shows a combined ion beam profile when overlapping two ion beam implantation profiles before and after beams emitted from the first ion beam emitter 122 and the second ion beam emitter 132 are moved by d in the x-axial or y-axial direction in the apparatus for forming a high-functional complex compound layer on the surface of a material 10 using ion implantation according to a preferred embodiment of the present disclosure.

The ion beam implantation profiles of the beams that are emitted from the first ion beam emitter 122 and the second ion beam emitter 132 have the shapes shown in FIG. 9. As described above, in order to overcome that a uniform ion beam profile (Gaussian distribution, etc.) does not come from the surface of a material, the straight line connecting the center $C_1$ of the bottom of the first ion beam emitter 122 and the center $C_3$ of the surface of a material 10 to each other is made perpendicular to the bottom of the first ion beam emitter 122 and perpendicular to the surface plane of the material 10 too, and is then aligned to the center $C_1$ of the bottom of the first ion beam emitter 122 that is the portion at which a maximum value is obtained as an ion beam implantation profile at a first end of the material 10 in the x-axial direction that is a first side direction of the surface of the material. Next, the straight line is moved in the x-axial direction by d that is the length of the x-axis of the material 10 and aligned again to the center $C_1$ of the bottom of the first ion beam emitter 122 that is the portion at which a maximum value is obtained as an ion beam implantation profile at a second end of the material in the x-axial direction, whereby it is possible to form a uniform (flat) combined ion beam implantation profile shown in FIG. 10 on the surface of the material 10 in the x-axial direction.

In this case, it is substantially difficult to move the first ion beam emitter 122 having a sealed structure, so the station 111 is moved by d in the x-axial direction. It can be applied in the same way to the second ion beam emitter 132. That is, when second ions are implanted, the station 111 is controlled to rotate by $\theta_2$ clockwise about the y axis. Similarly, a straight line connecting the center $C_2$ of the bottom of the second ion beam emitter 132 and the center $C_3$ of the surface of a material 10 to each other is perpendicular to the bottom of the second ion beam emitter 132 and perpendicular to the surface plane of the material 10 too, whereby an ion beam implantation profile of the second ion beam emitter 132 can be uniformly applied to the surface of the material 10.

Further, in order to form the uniform combined ion beam implantation profile shown in FIG. 10, when second ions are implanted, the controller controls the station 111 such that the axis directions constituting the surface of the station 111 in the x-axial and the y-axial direction such that uniform ion implantation distribution is achieved on the surface of the material 10 when ion beam implantation profiles overlap.

Meanwhile, in order to calculate a more accurate combined ion beam implantation profile, one or more sampling current measurement units that measure an ion beam current in real time are provided in addition to an ion beam implantation profile measured and stored in advance, so it is possible to calculate a current ion beam implantation profile by calculating the difference between the value of the real-time ion beam implantation profile and the previously stored ion beam implantation profile, whereby it is possible to apply ion beam implantation profile to controlling in real time for a real-time uniform ion implantation distribution. Similar to a temperature sensor 141 to be described below, it is preferable to transmit the measurement value of the ion beam current measurement unit to the controller 140 in a wireless type.

In this configuration, when the first ion beam emitter 122 is operated, the sampling current measurement unit (not shown) is disposed at a position in a virtual straight space between the first ion beam emitter 122 and a material 10 (the space between the dotted line $V_1$ and the dotted line $V_2$ in FIG. 1), and when the second ion beam emitter 132 is operated, the sampling current measurement unit is positioned in a virtual straight space between the second ion beam emitter 132 and a material 10. In this case, one sampling current measurement unit can simultaneously measure the ion beam current of the first ion beam emitter and the ion beam current of the second ion beam emitter, but a design of providing and putting a plurality of sampling current measurement units in charge of different ion beam emitters, respectively, is also possible.

Figure 6:
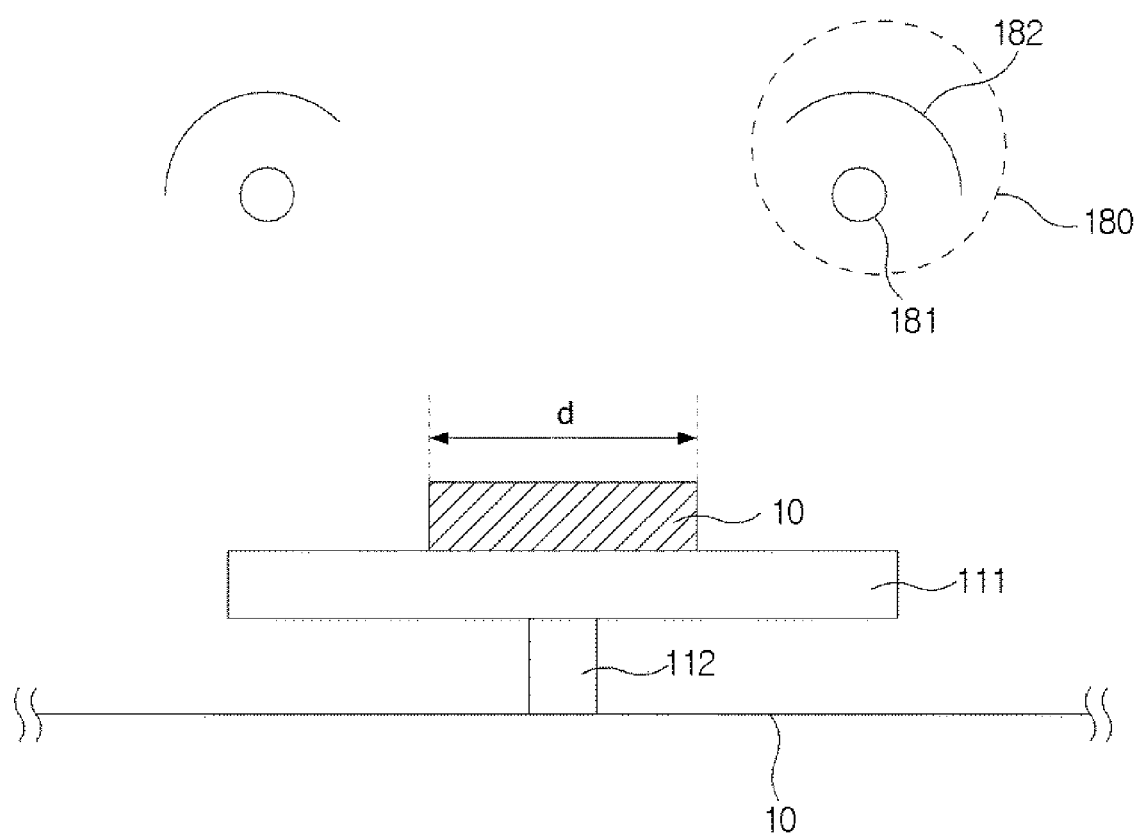
FIG. 6 is a schematic view showing the configuration of a material heating unit according to a preferred embodiment of the present disclosure.
Figure 7:
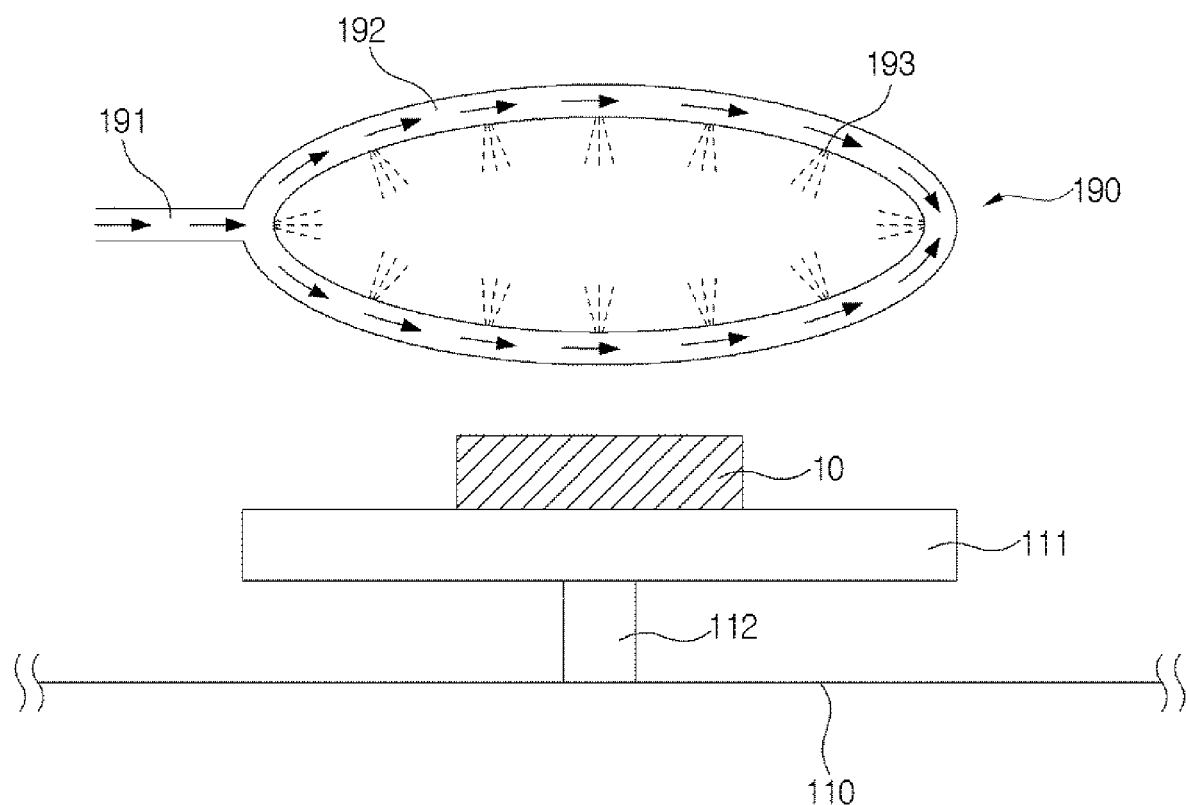
FIG. 7 is a schematic view showing the configuration of a material cooling unit according to a preferred embodiment of the present disclosure.

Meanwhile, FIG. 6 schematically shows a non-contact type material heating unit 180 of the apparatus for forming an apparatus for forming a high-functional compound layer on the surface of a material 10 using ion implantation according to a preferred embodiment of the present disclosure and FIG. 7 schematically shows a non-contact type material cooling unit 190 of the apparatus for forming an apparatus for forming a high-functional compound layer on the surface of a material 10 using ion implantation according to a preferred embodiment of the present disclosure.

The material heating unit 180 and the material cooling unit 190 are described with reference to FIGS. 6 and 7. It is preferable that the material heating unit 180 and the material cooling unit 190 are disposed at positions out of the virtual straight space between the first ion beam emitter 122 and a material 10 (the space between the dotted line $V_1$ and the dotted line $V_2$ in FIG. 1) (that is, positions at which an ion beam implantation profile is lower than a specific value or zero), are at positions out of the virtual straight space between the second first ion beam emitter 132 and a material 10, and are positioned over the station 111 unit 32.

As shown in FIGS. 6 and 7, the material heating unit 180 and the material cooling unit 190 are implemented in a non-contact type. By heating and cooling the surface of a material 10 a non-contact type, as described above, the material heating unit 180 and the material cooling unit 190 can control an ion implantation depth for the material 10 and can prevent discoloring or yellowing of the surface of the material 10.

In detail, as shown in FIG. 6, the material heating unit 180 may include a plurality of halogen lamps 181 radiating heat or the halogen lamps 181 and reflective plates 182 reflecting light from the halogen lamps 181 to the surface of a material 10—the halogen lamps 181 and reflective plates 182 are formed in a circumferential direction around the material 10 over the material—in order to be able to heat the material 10 in a non-contact type. It is preferable that the material heating unit 180 can also be adjusted in direction to be aligned with the surface of a material 10, as described above. The halogen lamp 181 functions as a heater and can increase a temperature up to a temperature at which a material 10 is not damaged. It is preferable that a temperature is increased to about 80° ° C. when a material 10 is a polymer, and a temperature is increased to about 100 to 200° ° C. when a material is metal.

Further, as shown in FIG. 7, it is preferable that the material cooling unit 190 includes an inert gas supply pipe 37 that is supplied with an inert gas such as argon from the outside of the vacuum chamber unit 110, a circular pipe 38 is connected to an end of the inert gas supply pipe, and a plurality of spray holes 193 is formed inside the circle of the circular pipe 38 such that an inert gas is sprayed to the surface of a material 10 (air shower) in order to be able to cool the material 10 in a non-contact type. It is preferable that not one, but a plurality of spray holes 193 is formed to be able to perform air shower. Since the inside of the vacuum chamber unit is in a vacuum state under $5 \times 10^{-5}$ [torr], it is possible to perform cooling through convection in the vacuum chamber unit 110 only by supplying an inert gas, but, when quick cooling or cooling control is required, it is also possible to adjust the temperature of an inert gas to a low temperature and then supply the inert gas.

Meanwhile, in order to accurately control the material heating unit 180 and the material cooling unit 190, one or more temperature sensors 141 that can measure a temperature in close contact with a side of a material 10 are inserted in the station 111, and if necessary, the temperature sensors 141 are protruded perpendicular to the plane of the station 111 on which a material 10 is placed, thereby measuring a temperature in close contact with a side of the material 10.

In this case, when the station 111 is controlled in four or more axial directions, there may be a possible of twisting of a wire when a measurement value of the temperature sensor 141 is transmitted to the controller 140 in a wire type. In order to prevent this problem, a configuration of transmitting a measurement value of the temperature sensor 141 to the controller 140 in a wireless type is employed in the present disclosure.

(Method of Forming a High-Functional Compound Layer on the Surface of a Material Using Ion Implantation and being Capable of Preventing Discoloring or Yellowing)

When the material surface reforming apparatus or method using ion implantation according to the present disclosure described above is used, it is possible to prevent yellowing or discoloring that may be generated when ions are implanted into a transparent material 10 such as PolyCarbonate (PC) or PolyEthylene Terephthalate (PET).

It is possible to maintain the original transparency or color of a material by performing control to cool the surface of the surface 10 in order to be able to prevent discoloring or yellowing of the material due to quantity of heat that is generated by ion implantation.

In detail, the inventors determined that the reason of yellowing of a transparent material 10 is heat energy that is supplied to the material by ion beam implantation, so the inventors attempted to cool the surface of the material while controlling the temperature of the surface of the material 10.

In this case, it is assumed that the energy that is supplied to the surface of the material due to ion beam implantation is Q (quantity of heat (cal)). The specific heat of the material is c (cal/g° C.). The specific heat of water is 1 cal/g° C. m is the weight (g) of the material 10. In this case, the surface of the material 10 is cooled by $\Delta T=Q/cm$ to remove the energy Q of the surface of the material 10 supplied by ion beam implantation. Accordingly, it is possible to maintain the transparency or the original color of the material 10.

In detail, in the material surface reforming apparatus using ion implantation according to the present disclosure, when ion beams are implanted by a current 50 mA at 50 kV, the amount of power that is supplied is 50 kV×50 mA=2,500 W=2,500 J/sec. When ion beams are supplied for 1 second in this way, energy (quantity of heat) of 2,500 J is supplied to the surface of the material 10. By dividing the energy by the specific heat of the material, a maximum temperature that the material 10 reaches due to ion beam implantation is obtained, and the material cooling unit 190 of the apparatus described above is controlled to cool the material by that amount. In general, the amount of power that is supplied is not all converted into heat energy, but it was assumed that the entire amount of power that is supplied is converted into heat energy and temperature is increased for a sufficient cooling margin.

(Glass Film Coating)

A material surface reforming apparatus using ion implantation that coats a glass film according to another embodiment of the present disclosure is described. For glass film coating, the surface of a material is stained with less or no water (moisture) and the degree of hardening (hardness) of the surface of the material 10 is increased. According to glass film coating in the related art, generally, it takes about 3 hours to apply silazane to a material 10 and harden the silazane by increasing a temperature to 350° C., so there is a problem that a lot of time is used, it is troublesome, and it is difficult to apply this manner to a material 10 that is easily influenced by an increase in temperature to 350° C.

Hereafter, coating a glass film on the surface of a material using the material surface reforming apparatus using ion implantation according to an embodiment of the present disclosure described above is described.

When silazane is applied to a plastic or polymer material 10 and a temperature is increased to 350° ° C. for hardening in accordance with the related art, there is a problem that the plastic or polymer melts at 350° C. In the present disclosure, the material surface reforming apparatus using ion implantation described above is used, that is, an ion beam of oxygen ($O_2$) is generated at any one of the first ion generator 121 or the second ion generator 132 and an ion beam of a hydrophobic substance such as Ar or F is generated at the other one, thereby increasing the hardness of the surface of a material 10 and hydrophobicity is also improved. That is, ions are implanted into the surface of a material 10 coated with silazane or another Si-based compound, thereby improving the degree of hardening and hydrophobicity of the surface of the material 10 even without heating up to 300° C. For reference, silazane is a general timer of compounds having an Si—N—Si bond is expressed as a general formula $H_3Si(NHSiH_2)nNHSi\ H_3$, and is called disilazane or trisilazane, depending on the number of silicon atoms.

Chemical bond with hydrogen (H) or nitrogen (N) of silazane or another Si-based compound is broken by ion implantation and oxygen (O) is bonded to the position through oxygen ion implantation, thereby improving hardness of the surface of a polymer or plastic material 10. Further, hydrophobicity of the surface of a polymer or plastic material 10 is improved by implanting a hydrophobic ion beam.

In this case too, as described above, a material heating unit 180 that heats a material 10 in a non-contact type and a material cooling unit 190 that cools the material 10 in a non-contact type are further included, and they are disposed at positions out of a virtual straight space between the first ion beam emitter 122 and the material 10 and at positions out of a virtual straight space between the second ion beam emitter 132, and are positioned over the station 111 in order not to interfere with emission of an ion beam from the first ion beam emitter 122 and emission of an ion beam from the second ion beam emitter 132.

In this method or apparatus, chemical bond of hydrogen (H) or nitrogen (N) is broken by implanting an oxygen ion beam with silazane or Si-based compound applied, and it is required to determine how to remove hydrogen (H) or nitrogen (N) that comes into the vacuum chamber unit 110 in order to prevent moisture or water from interfering with improvement of the degree of hardening or improvement of hydrophobicity of the material 10 by sticking to the material 10 even though hydrogen or nitrogen produces water by meeting an oxygen ion beam that is implanted.

To this end, in the present disclosure, the material 10 is heated at least over 100° C. and under the melting point of the material 10 through the material heating unit 180. In more detail, the material heating unit 180 includes a plurality of halogen lamps 181 radiating heat and reflective plates 182 reflecting light from the halogen lamps 181 to the surface of a material 10—the halogen lamps 181 and the reflective plates 182 are formed in a circumferential direction around the material 10 over the material 10—in order to be able to heat the material 10 in a non-contact type, prevents hydrogen separating from the material 10 from condensing on the surface of the material 10 by producing water by bonding to oxygen due to oxygen ion implantation in the material 10, and heats the material 10 at least over 100° C. and under the melting point of the material such that oxygen ions can be more smoothly implanted into the surface of the material 10 and the material 10 can be heated within the range in which it does not melt. That is, when temperature is increased over 100° C., water (moisture) vaporizes, but polymers resist without melting. As such a material 10 is heated, the reaction cross-sectional area in the material 10 is increased, so ions can be smoothly implanted.

Further, it is also possible to induce the moisture in the vacuum chamber unit 110 to condense at the material cooling unit 190. In this case, since an inert gas is not sprayed at the material cooling unit 190, the material 10 is not cooled and the material cooling unit 190 itself is cooled, thereby inducing moisture to condense on the outer surface of the material cooling unit 190. The circular pipe 38 in the material cooling unit may be formed over the station 111 in a circle large than the material 10, preferably, the station 111 so that moisture or water drops to the material 10 even though moisture condenses and drops in this way.

That is, it is preferable that the material cooling unit 190 includes an inert gas supply pipe 37 that is supplied with an inert gas from the outside of the vacuum chamber unit 110, a circular pipe 38 is connected to an end of the inert gas supply pipe, and a plurality of spray holes 193 is formed inside the circle of the circular pipe 38, so that an inert gas is sprayed to the surface of a material 10 in order to be able to cool the material 10 in a non-contact type. Further, the material cooling unit 190 further includes a liquid nitrogen pipe 40 inserted and sealed in the inert gas supply pipe 37 and the circular pipe and supplied with liquid nitrogen from the outside, and, depending on control by the controller, only liquid nitrogen is supplied into the liquid nitrogen pipe 40 without an inert gas sprayed to the surface of the material 10 through the spray holes 193 in a mode for removing moisture in the vacuum chamber unit 110 and only the outer surface of the material cooling unit 190 is cooled, thereby inducing the moisture in the vacuum chamber unit 110 to condense on the outer surface of the material cooling unit 190. As a result, it is possible to prevent hydrogen separating from a material 10 and producing water by bonding with oxygen due to oxygen ion implantation into the material from condensing on the surface of the material 10.

Figure 12:
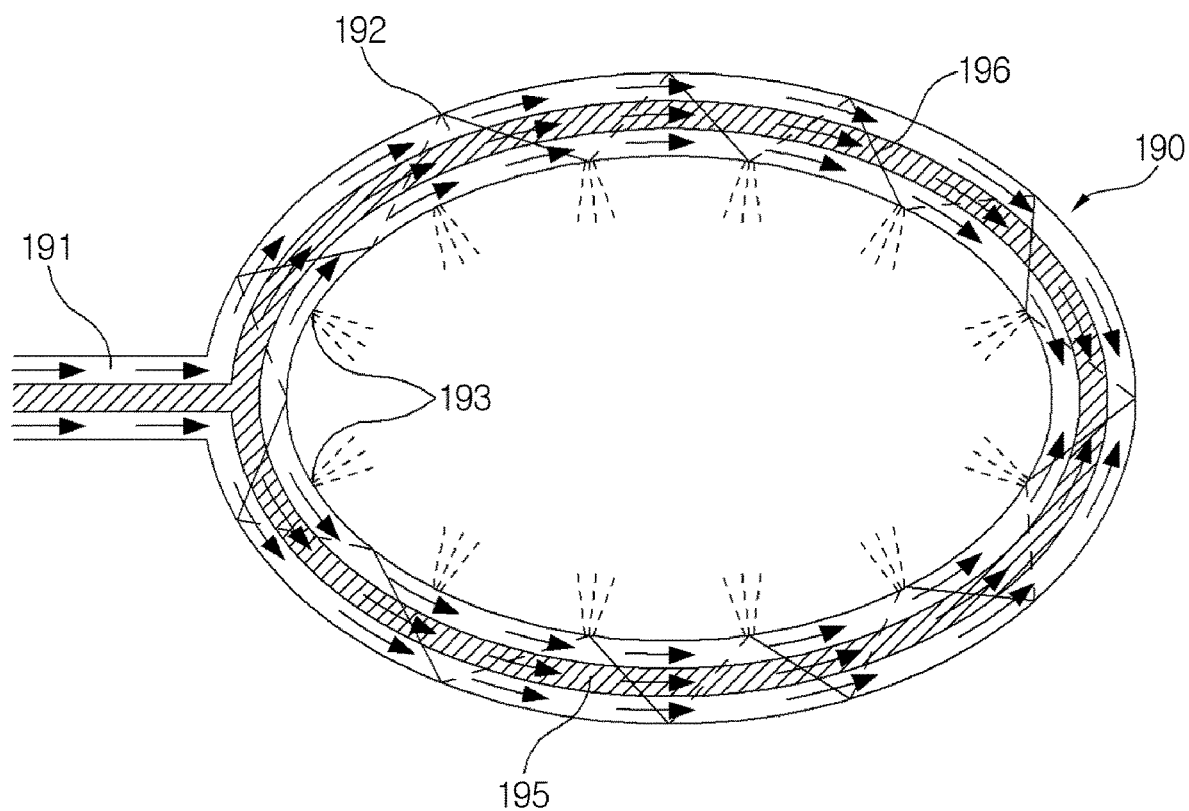
FIG. 12 is a schematic view showing another configuration of the material cooling unit according to a preferred embodiment of the present disclosure.

For reference, FIG. 12 schematically shows another embodiment of the non-contact type material cooling unit 190 of the apparatus for forming a high-functional compound layer on the surface of a material 10 using ion implantation according to a preferred embodiment of the present disclosure.

Further, the material cooling unit 190, as shown in FIG. 12, further includes a heat wire coil 195 having a shape surrounding the material cooling unit, and the heat wire coil 196 can be controlled by the controller to clean the material cooling unit 190 even without opening the vacuum chamber unit 110 or remove moisture condensed on the outer surface of the material cooling unit 190 by heating it for a predetermined time during ion implantation. By removing moisture in the vacuum chamber unit 10 in this way, it is possible to increase $SiO_2$ conversion efficiency. As a result, when the apparatus according to the present disclosure is used, it is possible to provide an apparatus and method that improves the degree of hardening and hydrophobicity of an Si-based compound inorganic polymer or a method and apparatus that improves the degree of hardening and hydrophobicity of a polymer material 10.

Further, it is preferable to make an oxygen atmosphere in the vacuum chamber unit 110 so that oxygen ions can be more smoothly implanted into the surface of a material 10. An $O_2$ atmosphere is made in the vacuum chamber unit 110 through air shower.

Unlike glass film coating that takes over 3 hours in the related art, it is possible to perform glass film coating within 30 minutes by using the apparatus according to the present disclosure. Further, when the glass film coating according to the present disclosure is applied to the folding portion of recent foldable smartphones, it is possible to greatly improve durability or hydrophobicity of the polymer on the display of the smartphones.

What is claimed is:

1. A material surface reforming apparatus using ion implantation, comprising:
   a vacuum chamber unit that has an internal space in which vacuum is selectively maintained, and has a station for placing a material that is a surface reforming target in the internal space;
   a first ion implanter that is mounted at the upper portion of the vacuum chamber unit, creates plasma composed of ionized gas particles or metal particles, and emits a first ion beam toward the material placed on the station by applying a voltage to the created plasma;
   a second ion implanter that is mounted at the upper portion of the vacuum chamber unit, creates plasma composed of ionized gas particles or metal particles, and emits a second ion beam toward the material placed on the station by applying a voltage to the created plasma; and
   a controller that controls operation of the first ion implanter and the second ion implanter such that a complex compound layer including an electric conductive layer is formed while ions are implanted into the surface of the material by emitting both of the first ion beam and the second ion beam or only one ion beam of the first ion beam and the second ion beam,
   wherein first ion implanter and the second ion implanter are spaced apart from each other and mounted at positions that are point-symmetric to each other at the upper portion of the vacuum chamber unit.

2. The material surface reforming apparatus of claim 1, wherein the vacuum chamber unit has an inlet gate that opens and closes on a first side and an outlet gate that opens and closes on a second side, and
   the material surface reforming apparatus further comprises:
   a supply chamber that has a hermetic internal space, has a supply gate that opens and closes on a first side thereof, and is disposed at a first side position of the vacuum chamber unit, is connected at a second side thereof to the internal space of the vacuum chamber unit through the inlet gate; and
   a discharge chamber that has a hermetic internal space, is disposed at a second side position of the vacuum chamber unit, is connected at a first side thereof to the internal space of the vacuum chamber unit through the outlet gate, and has a discharge gate that opens and closes on a second side thereof.

3. The material surface reforming apparatus of claim 2, further comprising a material conveyer unit that includes:

a first conveyer that is disposed in the supply chamber and conveys a material conveyed through the supply gate and being in a pre-surface processing state to the inlet gate;

a second conveyer that is disposed in the vacuum chamber unit and conveys a material conveyed through the inlet gate to the station;

a third conveyer that is disposed in the vacuum chamber unit and conveys a material in a post-surface processing state to the outlet gate; and a fourth conveyer that is disposed in the discharge chamber and conveys a material conveyed through the outlet gate to the discharge gate.

4. The material surface reforming apparatus of claim 3, wherein the controller individually controls operation of the supply gate, the inlet gate, the outlet gate, the discharge gate, the first conveyer, the second conveyer, the third conveyer, and the fourth conveyer such that a material is conveyed to the inlet gate by the first conveyer by opening the supply gate of the supply chamber with the inlet gate of the vacuum chamber unit closed, a material is conveyed to the station by the second conveyer by opening the inlet gate of the vacuum chamber unit with the supply gate of the supply chamber closed, and a material conveyed to the outlet gate by the third conveyer is conveyed to the discharge gate by the fourth conveyer by opening the outlet gate of the vacuum chamber unit with the inlet gate of the vacuum chamber unit and the discharge gate of the discharge chamber closed.

5. The material surface reforming apparatus of claim 4, wherein the vacuum chamber unit further includes a first pressure adjuster that adjusts the pressure of the internal space, the supply chamber includes a second pressure adjuster that adjusts the pressure of the internal space, the discharge chamber includes a third pressure adjuster that adjusts the pressure of the internal space, and the controller controls operation of the first pressure adjuster, the second pressure adjuster, and the third pressure adjuster such that the internal space of the vacuum chamber unit is maintained in vacuum at a first pressure required for creating plasma, and the supply chamber and the discharge chamber are maintained in vacuum at a second pressure relatively lower than the atmospheric pressure and relatively higher than the first pressure.

6. The material surface reforming apparatus of claim 5, wherein the internal space of the supply chamber and the internal space of the discharge chamber are relatively smaller in volume than the internal space of the vacuum chamber unit.

7. The material surface reforming apparatus of claim 6, wherein the supply chamber further includes a volume adjuster detachably mounted over the first conveyer in the internal space, and wherein the volume adjuster is mounted in the internal space such that the volume of the internal space decreases and the time for the second pressure adjuster to adjust the pressure of the internal space to the second pressure is reduced, and is separated from the internal space to expand the space over the first conveyer so that it is possible to convey a material having a relatively large height.

8. The material surface reforming apparatus of claim 5, wherein a plurality of inlet gates is disposed on the first side of the vacuum chamber unit, a plurality of discharge chambers is disposed at the first side position of the vacuum chamber unit and is connected at second sides thereof to the internal space of the vacuum chamber unit through the inlet gates, respectively, a plurality of first conveyers is disposed in the supply chambers, respectively, and conveys materials conveyed through the supply gates and being in a pre-surface processing state to the inlet gates, respectively, a plurality of second conveyers is disposed in the vacuum chamber unit and conveys the materials conveyed through the inlet gates, respectively, to the station, and the controller controls operation such that every time a material is conveyed to the vacuum chamber unit from one supply chamber, the internal space of another supply chamber is maintained in vacuum at the second pressure with a material conveyed in the supply chamber.

9. The material surface reforming apparatus of claim 5, wherein the controller individually controls operation of the supply gate, the inlet gate, the outlet gate, the discharge gate, the first conveyer, the second conveyer, the third conveyer, the fourth conveyer, the first ion implanter, and the second ion implanter such that a material is conveyed to the inlet gate by the first conveyer by opening the supply gate of the supply chamber with the internal space of the vacuum chamber unit maintained in vacuum at the first pressure, a material is conveyed to the station by the second conveyer by opening the inlet gate with the supply gate of the supply chamber closed and the internal space of the supply chamber maintained in vacuum at the second pressure, a complex compound layer is formed on the surface of a material by a first ion beam and a second ion beam with the inlet gate of the vacuum chamber unit closed and the internal space of the vacuum chamber unit maintained in vacuum at the first pressure, a material conveyed to the outlet gate by the third conveyer is conveyed to the discharge gate by the fourth conveyer by opening the outlet gate of the vacuum chamber unit with the internal space of the discharge chamber maintained in vacuum at the second pressure, and the inlet gate of the vacuum chamber unit and the discharge gate of the discharge chamber closed, and the discharge gate of the discharge chamber is opened with the outlet gate of the vacuum chamber unit closed.

* * * * *